(12) United States Patent
Yasuzato et al.

(10) Patent No.: US 6,355,382 B1
(45) Date of Patent: Mar. 12, 2002

(54) PHOTOMASK AND EXPOSURE METHOD USING A PHOTOMASK

(75) Inventors: Tadao Yasuzato; Shinji Ishida, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/473,994

(22) Filed: Dec. 29, 1999

(30) Foreign Application Priority Data

Jan. 8, 1999 (JP) .......................................... 11-002965

(51) Int. Cl.⁷ ................................................. G03F 9/00
(52) U.S. Cl. ......................................................... 430/5
(58) Field of Search ..................... 430/5, 322; 716/19, 716/20, 21; 250/492.22

(56) References Cited

U.S. PATENT DOCUMENTS

| | | | |
|---|---|---|---|
| 5,436,095 A | * | 7/1995 | Mizuno et al. ................. 430/5 |
| 6,048,647 A | * | 4/2000 | Miyazaki et al. ............... 430/5 |

FOREIGN PATENT DOCUMENTS

| | | |
|---|---|---|
| JP | 2-140743 | 5/1990 |
| JP | 4-273428 | 9/1992 |
| JP | 05-19446 | 1/1993 |
| JP | 05-142751 | 6/1993 |
| JP | 06-95360 | 4/1994 |
| JP | 06-123963 | 5/1994 |
| JP | 7-199448 | 8/1995 |
| JP | 7-253649 | 10/1995 |
| JP | 10-92706 | 4/1998 |
| JP | 10-239827 | 9/1998 |

* cited by examiner

*Primary Examiner*—S. Rosasco
(74) *Attorney, Agent, or Firm*—Sughrue Mion, PLLC

(57) ABSTRACT

Disclosed is a photomask in which contrast of light intensity of a pattern to be transferred (main pattern) is enhanced on an image plane while transfer of auxiliary pattern themselves is suppressed. The photomask, which is used in exposure to which is applied four-point illumination method for inverting phase of light that passes through mutually adjacent patterns, has first auxiliary patterns, disposed above and below and to the left and right of a main pattern to be transferred, to thereby provide a transparent substrate with a surface flush with the main pattern or with a difference in level corresponding to a phase difference with respect to the main pattern that is K times 360° (where K is an integer that does not include zero), and second auxiliary patterns disposed at angles of 45° with respect to the main pattern, the second auxiliary patterns providing a difference in level corresponding to a phase difference, with respect to the first auxiliary patterns, that is (2L+1) times 180° (where L is an integer inclusive of zero). The contrast of the first auxiliary patterns is reduced by the second auxiliary patterns, thereby enlarging the depth of focus.

39 Claims, 26 Drawing Sheets

1; MAIN PATTERN
2b; SECOND AUXILIARY PATTERN
2a; FIRST AUXILIARY PATTERN

C-C'

3; OPAQUE FILM
4; TRANSPARENT SUBSTRATE

D-D'

6; PLANES OF IDENTICAL PHASE OF TRANSMITTED LIGHT
4; TRANSPARENT SUBSTRATE
3; OPAQUE FILM
AREA IN WHICH PHASE IS NOT CONSTANT

FIG. 5 (a)
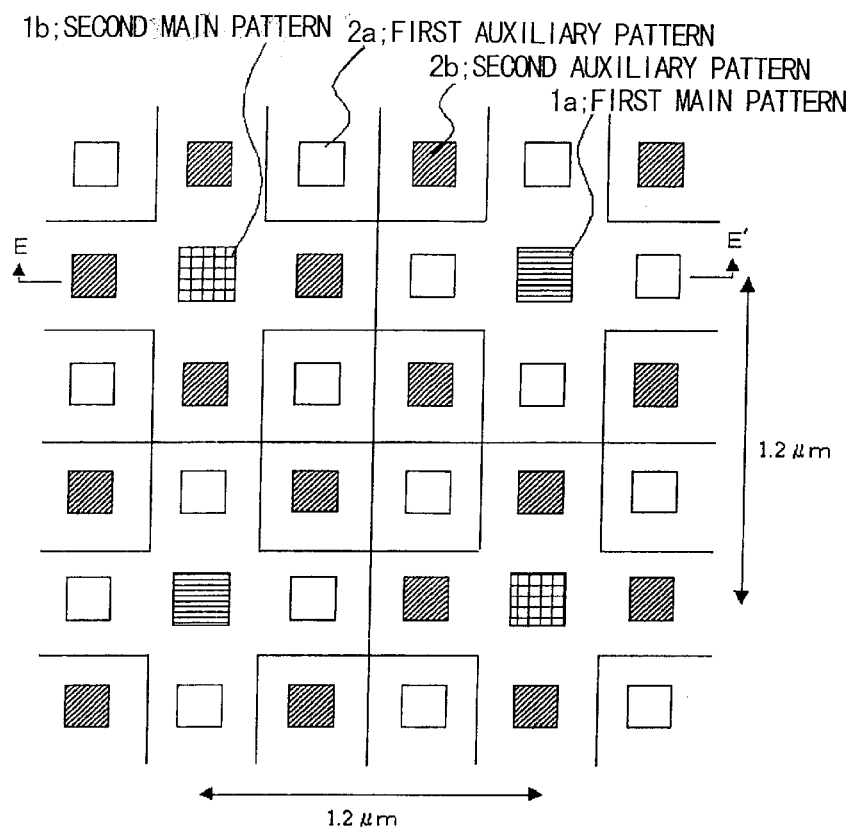
FIG. 5 (b)    E-E'
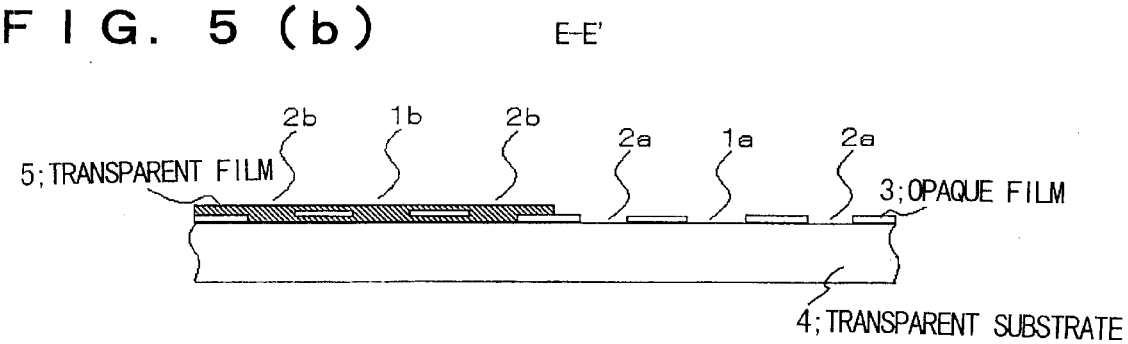

F I G. 1 1 (a)
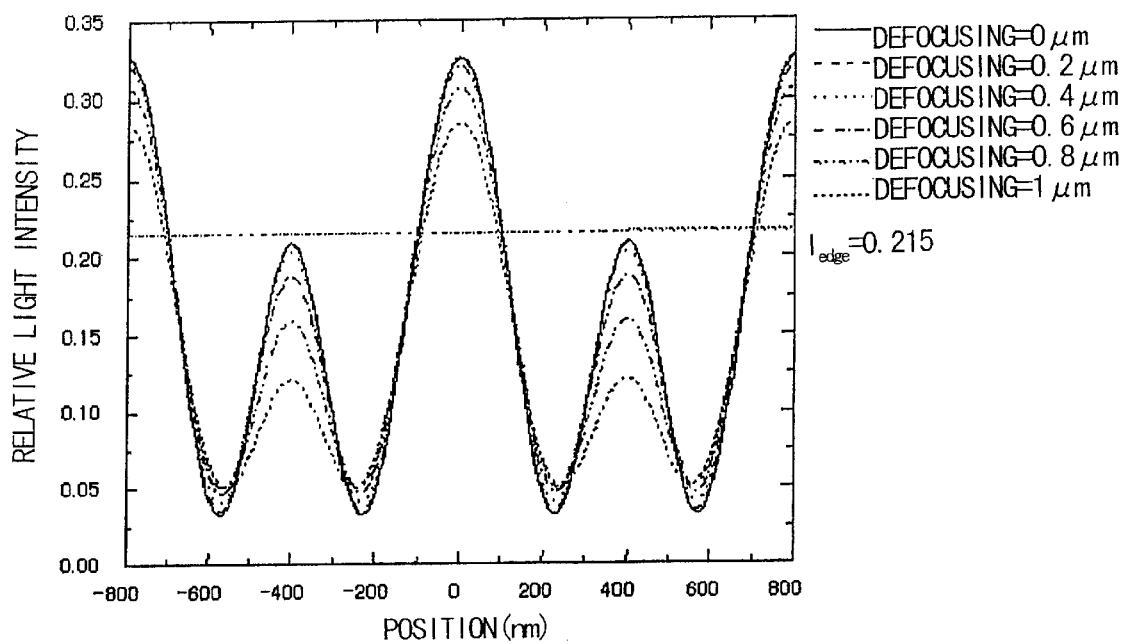
F I G. 1 1 (b)
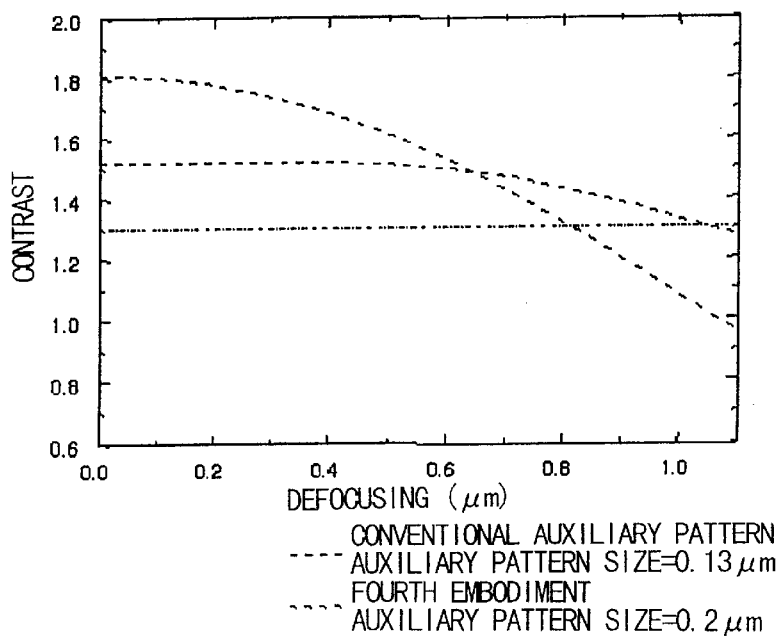

1a; FIRST MAIN PATTERN
2a; FIRST AUXILIARY PATTERN
1b; SECOND MAIN PATTERN
2b; SECOND AUXILIARY PATTERN

4; TRANSPARENT SUBSTRATE
3; OPAQUE FILM

F I G. 1 3
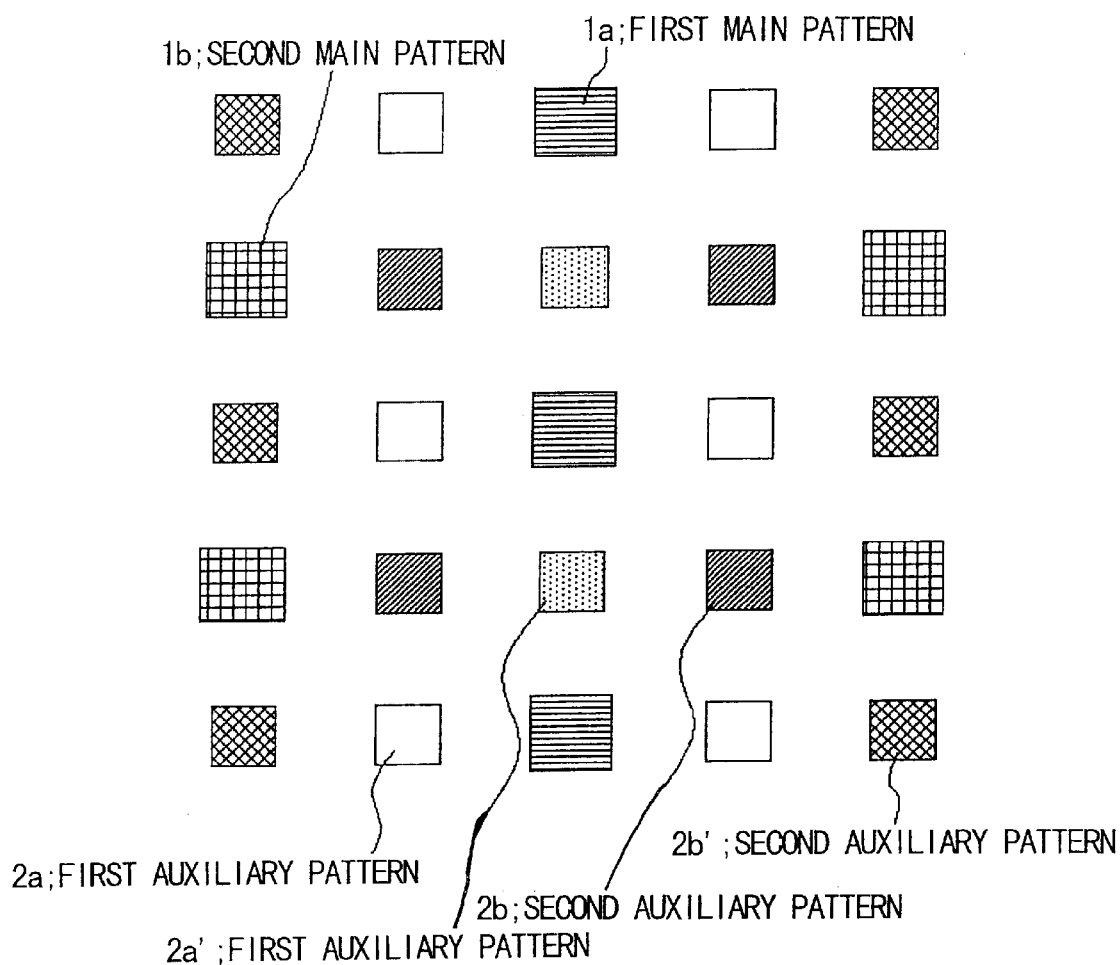

1; MAIN PATTERN      2a; FIRST AUXILIARY PATTERN
2b; SECOND AUXILIARY PATTERN

F I G. 1 6 (a)
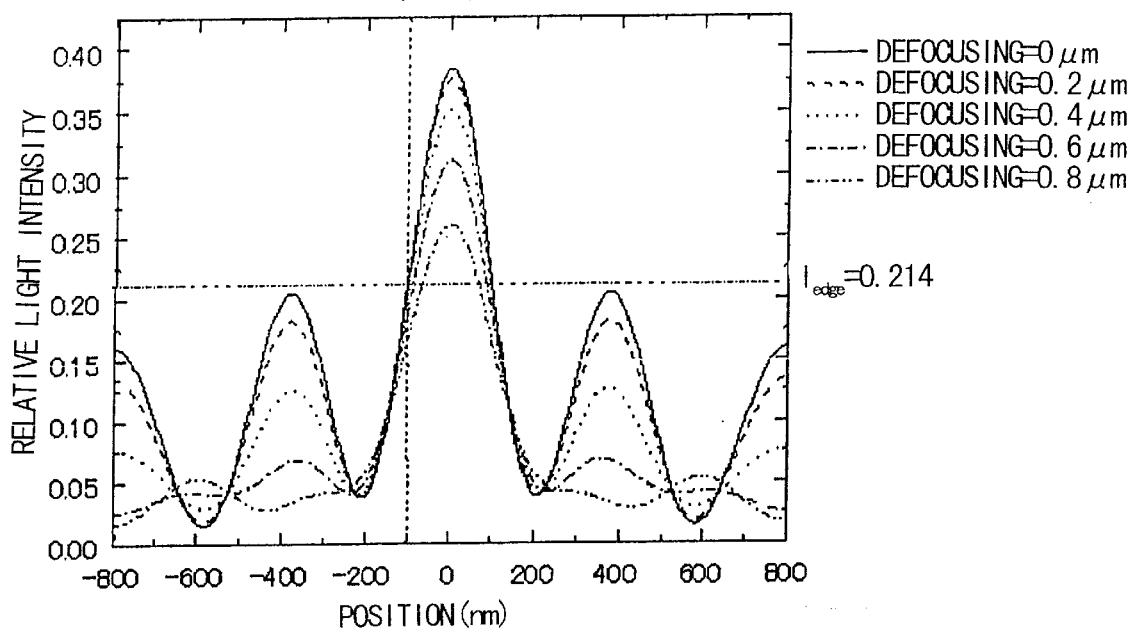
F I G. 1 6 (b)
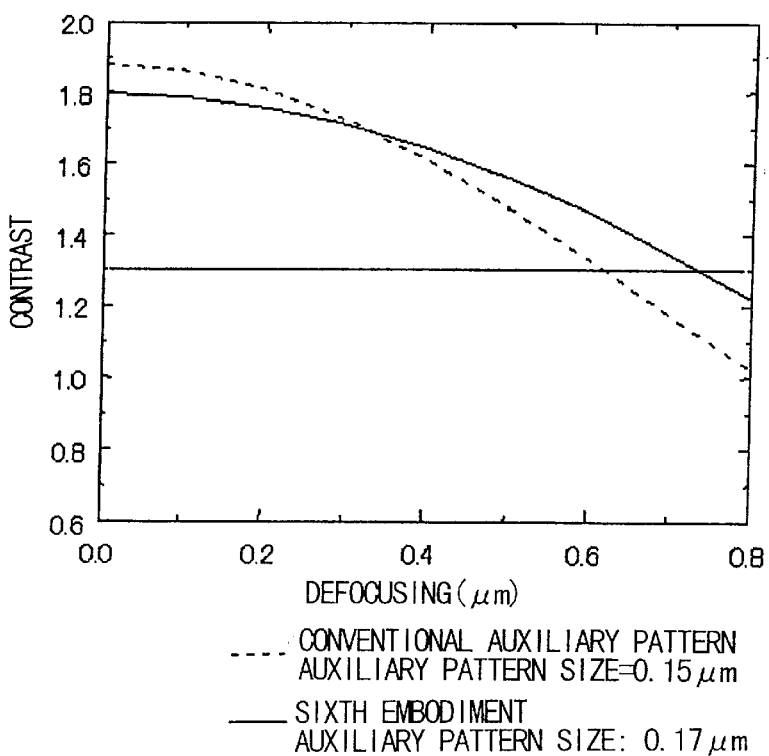

FIG. 19
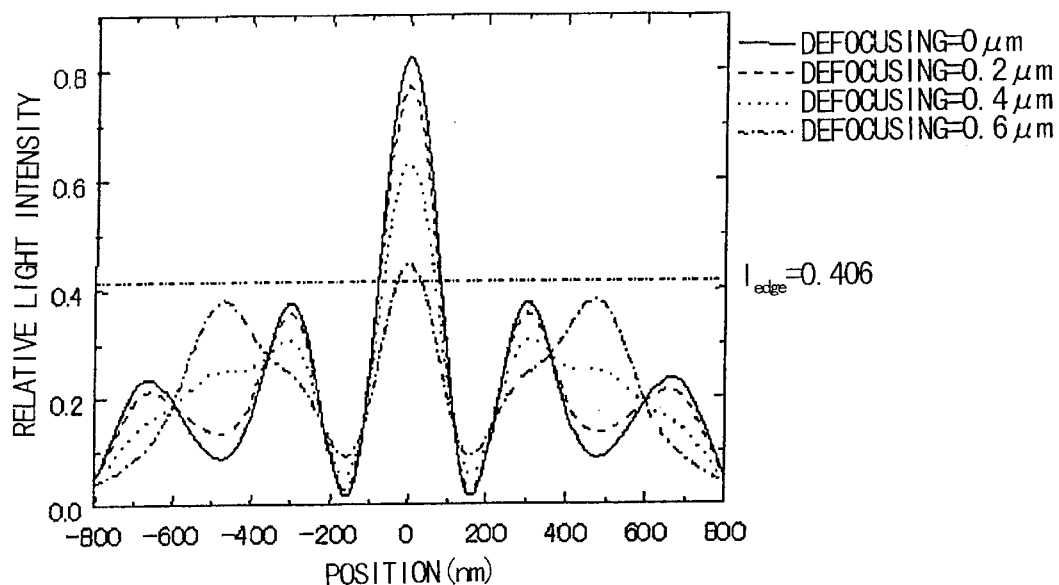
FIG. 20 (a) PRIOR ART
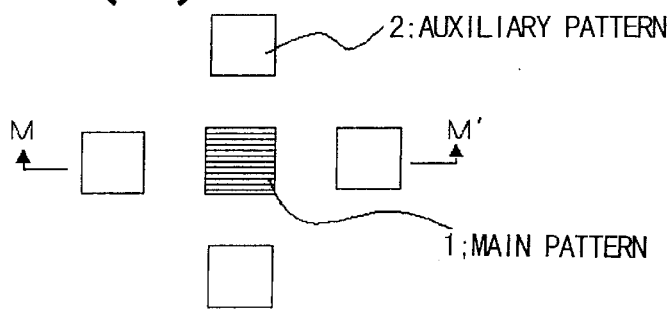
FIG. 20 (b) PRIOR ART
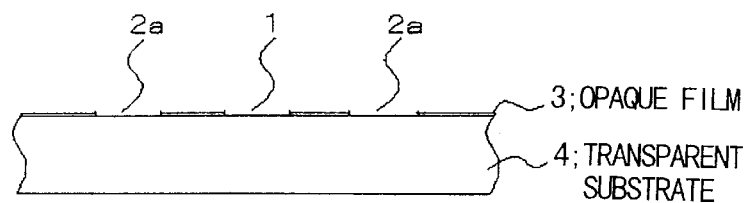

F I G. 2 1
PRIOR ART
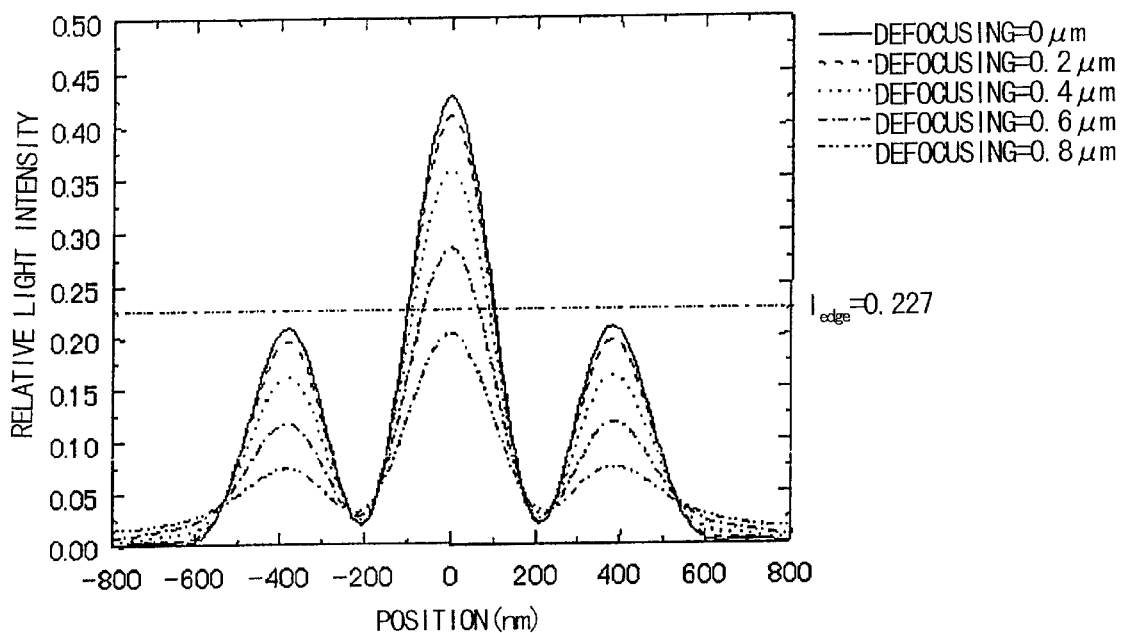
F I G. 2 2 (a)
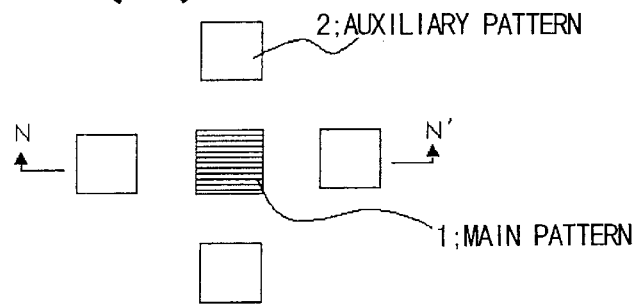
F I G. 2 2 (b)
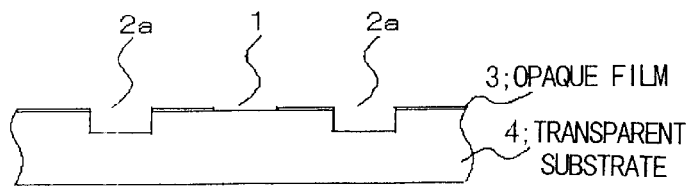

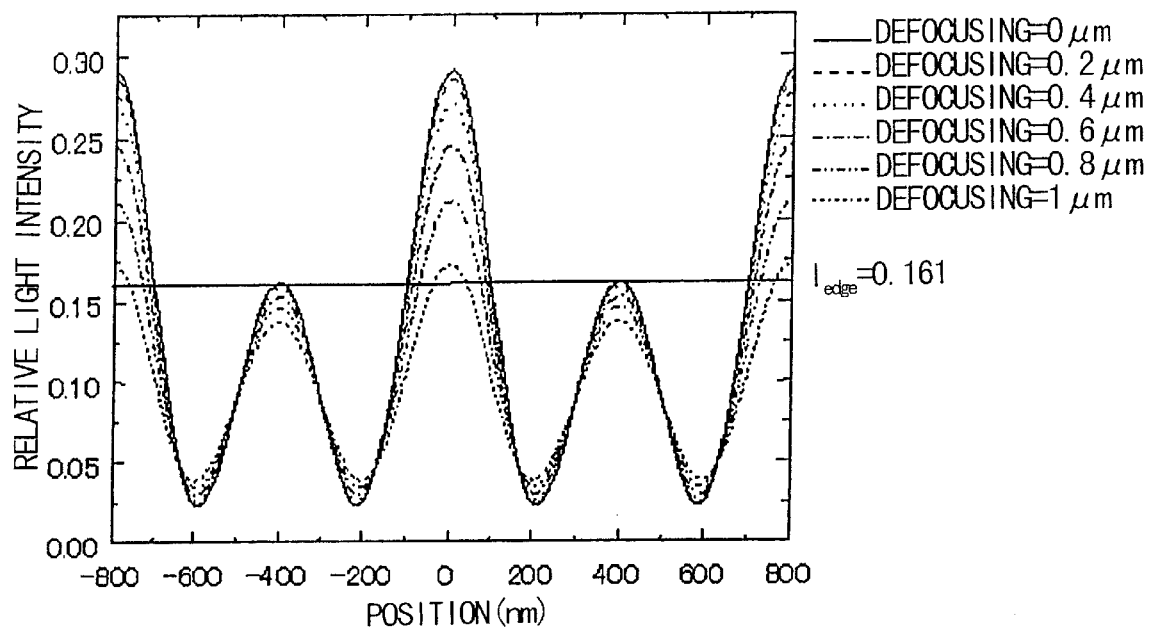
F I G. 2 8     PRIOR ART

F I G. 2 9 (a) PRIOR ART
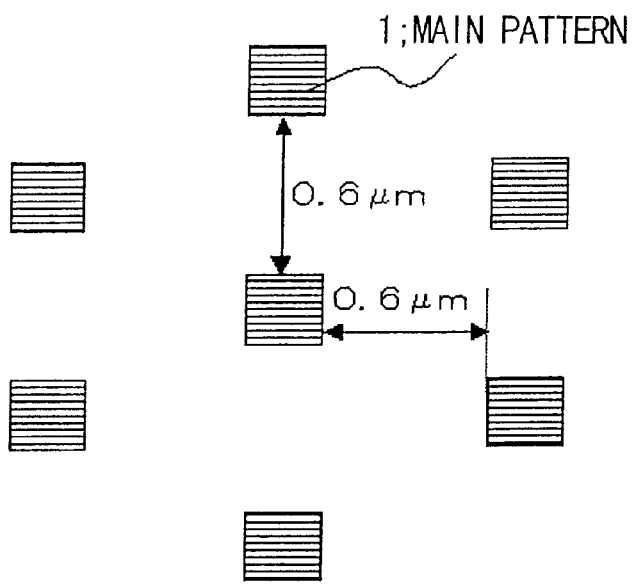
F I G. 2 9 (b) PRIOR ART
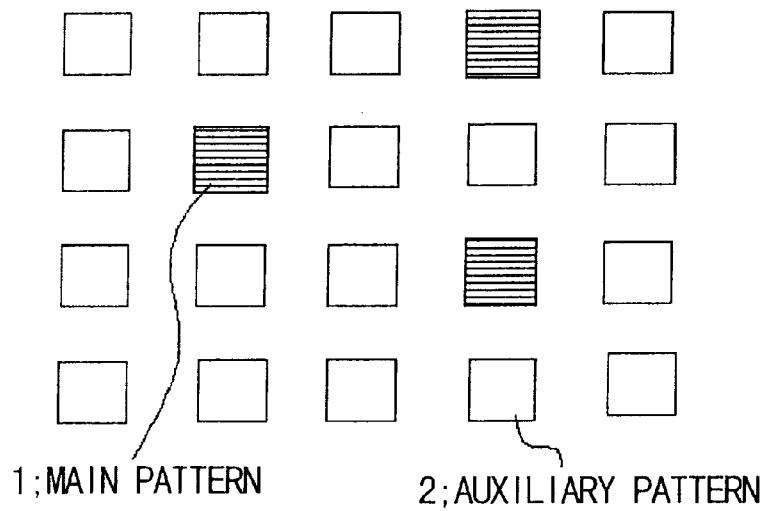

1; MAIN PATTERN    2; AUXILIARY PATTERN

3; OPAQUE FILM
4; TRANSPARENT SUBSTRATE

PHOTOMASK AND EXPOSURE METHOD USING A PHOTOMASK

FIELD OF THE INVENTION

This invention relates to a photomask and to an exposure method using a photomask.

BACKGROUND OF THE INVENTION

Semiconductor devices are becoming more and more tightly packed in density and increasingly fine, and this has been accompanied by the need to provide finer circuit patterns on semiconductor substrates. Various improvements in lithography have been made in order to satisfy this need.

In existing lithographic techniques, raising the fineness of resist patterns that are transferred to semiconductor substrates has been dealt with mainly by developing exposure equipment and especially by raising the numerical aperture (NA) of projection lens optics. In general, the limit on a fine pattern that is capable of being resolved (i.e., critical resolution R) and NA are related as follows: $R = K_1 \times \lambda/NA$ (where $K_1$ is a process-dependent constant such as the performance of a photosensitive resin and $\lambda$ represents wavelength). This means that the critical resolution can be reduced in inverse proportion to an increase in NA. However, depth of focus (DOF), namely the range over which displacement of focal point is allowed, and NA are related as follows: $DOF = K_2 \times \lambda/NA$ (where $K_2$ is a process-dependent constant). As a consequence, raising the numerical aperture NA has the converse effect of shortening depth of focus.

Currently existing semiconductor devices are manufactured by repeating the steps of film formation, resist-pattern formation and etching, etc. As a result, a step or difference in level on the order of several microns usually develops on the semiconductor substrate.

If it is attempted to form a resist pattern on a semiconductor substrate having such a step, the focal point at the top of the step will differ from that at the bottom, making it difficult to form a highly precise fine pattern. In view of this, obtaining a large depth of focus is a major challenge in the manufacture of modern semiconductor devices.

Studies for the purpose of increasing depth of focus have been conducted taking a variety of approaches. Specifically, one example of a technique employed on the side of the illumination optics is a super-resolution technique referred to as the modified illumination method or oblique incidence (off-axis) illumination method. One example of a technique which is an improvement on the side of the photomask is to use an auxiliary pattern. It should be noted that a photomask is a master sheet for exposure formed into a pattern comprising transparent and opaque areas and is referred to in particular as a "reticle" unless the reduction ratio is 1:1. Here, however, the term "photomask" will be used regardless.

The modified illumination method, which approaches the problem of depth of focus from the side of the illumination optics, will be described in simple terms first. The modified illumination method is classified into a ring illumination method, which shields the central portion of an aperture stop and uses a ring-shaped illuminating light source, and a four-point illumination method that uses an aperture stop open only at the four corners of the sides thereof.

In an ordinary illumination optical system, light impinges upon the patterned photomask perpendicularly and transfers the pattern onto the semiconductor substrate through a projection lens system. Use is made of diffracted light of order 0 and order +1 or −1 in pattern resolution. As the pattern becomes finer, however, the angle of diffraction increases and eventually only diffracted light of order 0 impinges upon the projection lens system. As a consequence, the light that passes through the fine pattern is substantially the perpendicular component only and there is a decline in the contrast of the light-intensity distribution on the image plane.

However, with the four-point illumination method, for example, only oblique light impinges upon the photomask. As a result, either diffracted light of order +1 or −1 impinges upon the projection lens system and the contrast of the light-intensity distribution on the image plane can be improved. Since the contrast of the light-intensity distribution is thus enhanced by causing the illuminating light to impinge obliquely, satisfactory resolution can be obtained even if the position of the focal point is displaced. This makes it possible to increase depth of focus.

However, this modified illumination method is a technique that is effective in cases where the photomask pattern is a periodically repeating pattern that gives rise to diffracted light: it is not effective for an isolated pattern that lacks periodicity. Accordingly, for an isolated pattern of this kind, use is made of a method in which fine patterns (referred to as "auxiliary patterns" hereinafter in the entire disclosure) that are not allowed to be transferred to the semiconductor substrate are provided around the isolated pattern in order to provide this pattern with periodicity.

The technique using these auxiliary patterns will be described with reference to FIGS. 20 and 21. FIG. 20 illustrates a conventional photomask for the auxiliary pattern scheme, in which (a) is a view showing pattern layout on the photomask and (b) is a sectional view taken along line M–M' of (a). FIG. 21 is a graph illustrating the distribution of the intensity of light on the plane on which the image is formed in a case where exposure is performed using the photomask of FIG. 20.

With this conventional technique, in a case where use is made of the four-point illumination method, auxiliary patterns 2 are disposed above and below and to the left and right of the pattern to be resolved (referred to as main pattern 1) and are spaced a prescribed distance away from the main pattern 1 to provide the pattern with periodicity. If the position of the focal point is shifted in a case where only the isolated main pattern 1 is present, the skirt of the distribution of the intensity of light on the imaging surface broadens greatly and resolution undergoes a pronounced decline. When the auxiliary patterns 2 are provided, however, a phase-inverting effect ascribable to oblique incidence occurs between the main pattern 1 and the auxiliary patterns 2 and contrast is enhanced. Even if defocusing is performed, therefore, it is possible to suppress a decline in resolution.

SUMMARY OF THE DISCLOSURE

Various problems have been encountered in the course of intense investigation towards the present invention.

Namely, by using the oblique incidence illumination method as the method of illumination and forming the auxiliary patterns in the photomask, the contrast of light intensity on the image plane is enhanced even at an isolated pattern and resolution can be improved. However, a problem which arises is that the auxiliary patterns themselves are transferred to the semiconductor substrate when the auxiliary patterns are formed on the photomask.

More specifically, because an auxiliary pattern has the main pattern on only one side thereof and no patterns on its other sides, the contrast of light intensity on the image plane does not become as large as it does in the case of the main pattern but the intensity of light at the portion corresponding to the auxiliary pattern is not zero either. Depending upon conditions such as the size of the main pattern, therefore, the auxiliary pattern also is transferred to the semiconductor substrate. This is discriminated as a defect in a wafer inspection (KLA, etc.).

Taking into account the effects of interference of transmitted light, the closer the size of an auxiliary pattern approaches that of the main pattern, the greater the contribution to contrast enhancement of the main pattern. If the auxiliary pattern is made too large, however, a problem which arises is that the auxiliary pattern itself tends to be transferred to the semiconductor substrate. Methods have been proposed to solve this problem. For example, there is a method of suppressing transfer of the auxiliary pattern by finely splitting the auxiliary patterns (see the specification of Japanese Patent Kokai Publication JP-A-10-92706), a method of lowering the contrast of the auxiliary patterns by shifting the position of the focal point in a number of stages (see the specification of Japanese Patent Kokai Publication JP-A-4-273428), and a method of forming the auxiliary pattern by engraving a photomask (see the specification of Japanese Patent Kokai Publication JPA-10-239827).

Among the methods mentioned above, the method of finely splitting the auxiliary patterns is effective in suppressing transfer of the individual auxiliary patterns. However, since portions substantially devoid of the auxiliary patterns are produced, a problem which arises is that contrast cannot be improved with regard to all portions of the main pattern.

The method of forming auxiliary patterns by engraving a photomask will be described with reference to FIG. 22. FIG. 22, which is described in a Japanese application filed previously by the present inventor, includes a view (a) showing the layout of patterns on a photomask and a sectional view (b) taken along line N–N' of (a).

According to this method, auxiliary patterns 2 disposed above and below and to the left and right of the main pattern 1 are formed by engraving a transparent substrate 4 in such a manner that phase of the auxiliary patterns shifts by 360° with respect to the phase of the main pattern 1. With this structure, the phase of transmitted light is disturbed by the step or difference in level around the auxiliary patterns 2 so that interference is produced between this light and light that passes through the center of the auxiliary patterns. This has the effect of reducing the light intensity of the auxiliary patterns 2. However, it is still difficult to prevent satisfactorily the transfer of the auxiliary patterns themselves.

Accordingly, a principal object of the present invention is to provide a photomask and an exposure method using a photomask in which the contrast of light intensity of a pattern to be transferred is enhanced on an image plane while transfer of auxiliary pattern themselves is suppressed.

Other objects of the present invention will become apparent in the entire disclosure.

According to a first aspect of the present invention, there is provided a photomask comprising a desired main pattern to be transferred, and a plurality of auxiliary patterns which produce an interference effect with the main pattern by diffraction, wherein the plurality of auxiliary patterns are constituted by two or more pattern groups which have mutually different pattern sizes and which cause light that passes through respective ones of the auxiliary patterns to have mutually different phases on an image plane.

According to a second aspect of the present invention, there is provided a photomask comprising a desired main pattern to be transferred; a first auxiliary pattern disposed on at least one side of the main pattern at such a spacing that contrast of light, which passes through the main pattern, is enhanced on an image plane; and a second auxiliary pattern disposed on at least one side of the first auxiliary pattern at such a spacing that contrast of light, which passes through the first auxiliary pattern, is weakened on the image plane by diffraction.

According to a third aspect of the present invention, there is provided a photomask used in exposure to which is applied the modified illumination method for inverting the phase of light that passes through mutually adjacent patterns formed on a transparent substrate, comprising: four first auxiliary patterns disposed on a mask plane above and below and to the left and right of and a predetermined distance away from a desired main pattern to be transferred, thereby providing the transparent substrate with a surface flush with the main pattern or with an optical path difference corresponding to a phase difference, with respect to the main pattern, that is K times 360° (where K is an integer that does not include zero); and four second auxiliary patterns disposed at positions corresponding to any of the sides above and below and to the left and right of the first auxiliary patterns at angles of 45° with respect to the desired main pattern on the mask plane, thereby providing the transparent substrate with an optical path difference corresponding to a phase difference, with respect to the first auxiliary patterns, that is (2L+1) times 180° (where L is an integer inclusive of zero).

According to a fourth aspect of the present invention, there is provided a photomask used in exposure to which is applied the modified illumination method for inverting the phase of light that passes through mutually adjacent patterns formed on a transparent substrate, wherein (a) the photomask has a plurality of main patterns to be transferred, the main patterns repeating at prescribed intervals; (b) four first auxiliary patterns are disposed on a mask plane above and below and to the left and right of and a predetermined distance away from one main pattern among the plurality of main patterns, thereby providing the transparent substrate with a surface flush with the one main pattern or with an optical path difference corresponding to a phase difference, with respect to the one main pattern, that is K times 360° (where K is an integer that does not include zero); four second auxiliary patterns being disposed on the mask plane at positions corresponding to any of the sides above and below and to the left and right of the first auxiliary patterns at angles of 45° with respect to the one main pattern, thereby providing the transparent substrate with an optical path difference corresponding to a phase difference, with respect to the first auxiliary patterns, that is (2L+1) times 180° (where L is an integer inclusive of zero); the one main pattern, the four first auxiliary patterns and the four second auxiliary patterns constructing a first group; (c) another main pattern neighboring the one main pattern has a phase that is opposite that of the one main pattern; four second auxiliary patterns being disposed above and below and to the left and right of and a predetermined distance away from the other main pattern among the plurality of main patterns, thereby providing the transparent substrate with a surface flush with the other main pattern or with an optical path difference corresponding to a phase difference, with respect to the other main pattern, that is K times 360° (where K is an integer that does not include zero); four first auxiliary patterns being disposed on the mask plane at positions corresponding to any of the sides above and below and to the left and right of the second auxiliary patterns at angles of 45° with respect to the other main pattern, thereby providing the transparent substrate with an optical path difference corresponding to a phase difference, with respect to the second auxiliary patterns, that is (2L+1) times 180° (where L is an integer inclusive of zero); the other main pattern, the four first auxiliary patterns and the four second auxiliary patterns constructing a second group; and (d) the first group and the second group are arrayed repeatedly so as to establish a relationship in which the auxiliary patterns constituting the first group are opposite in phase to the corresponding auxiliary patterns constituting the second group.

According to a fifth aspect of the present invention, there is provided a photomask used in exposure to which is applied a modified illumination method for inverting the phase of light that passes through mutually adjacent patterns formed in a transparent substrate, wherein the photomask has first line-shaped (linear) auxiliary patterns disposed on a mask plane on both sides of and a predetermined distance away from a desired line-shaped (linear) main pattern to be transferred, thereby providing the transparent substrate with a surface flush with the main pattern or with an optical path difference corresponding to a phase difference, with respect to the main pattern, that is K times 360° (where K is an integer that does not include zero); and second line-shaped (linear) auxiliary patterns disposed on the mask plane outwardly of and a predetermined distance away from the first line-shaped auxiliary patterns, thereby providing the transparent substrate with an optical path difference corresponding to a phase difference, with respect to the first line-shaped auxiliary patterns, that is (2L+1) times 180° (where L is an integer inclusive of zero).

According to a sixth aspect of the present invention, there is provided a multiple-stage focusing exposure method for performing exposure a plurality of times by achieving focusing on at least upper and lower levels of a difference in level when an image of exposing light is formed on a resist film that has been applied to a semiconductor substrate having the difference in level, characterized by performing exposure using the photomasks described above.

Other aspects and features are also mentioned in the appended claims, the disclosure whereof should be incorporated herein with reference thereto, upon needed.

By virtue of the construction described above, the present invention improves the contrast of the main pattern and, by bringing the phases of the auxiliary patterns into agreement, weakens the contrast of these patterns so that transfer of the auxiliary patterns can be suppressed and depth of focus enlarged.

Other features and advantages of the present invention will be apparent from the entire disclosure, particularly following description taken in conjunction with the accompanying drawings, in which like reference characters designate the same or similar parts throughout the figures thereof.

BRIEF DESCRIPTION OF THE DRAWINGS

FIG. 5 is a diagram schematically illustrating the construction of a photomask according to a third embodiment of the present invention, in which (a) is a top view and (b) a sectional view taken along line E–E' of (a);

FIG. 11 is a diagram useful in describing effects in a case where multi-stage focusing exposure is performed using the photomask according to the fourth embodiment, in which (a) is a graph illustrating the distribution of light intensity on an image plane and (b) a graph showing contrast of a main pattern versus position of defocusing;

FIG. 13 is a top view schematically illustrating another construction of a photomask according to the fifth embodiment;

FIG. 16 is a diagram useful in describing effects in a case where exposure is performed using the photomask according to the sixth embodiment, in which (a) is a graph illustrating the distribution of light intensity on an image plane and (b) a graph showing contrast of a main pattern versus position of defocusing;

FIG. 19 is a graph useful in describing the distribution of light intensity on an image plane in a case where the photomask of FIG. 18 is used;

FIG. 20 is a diagram schematically illustrating the construction of a photomask according to the prior art, in which (a) is a top view and (b) a sectional view taken along line M–M' of (a);

FIG. 21 is a graph useful in describing the distribution of light intensity on an image plane in a case where the photomask of FIG. 20 is used;

FIG. 22 is a diagram schematically illustrating the construction of a photomask according to an earlier Japanese application aforementioned of the same applicant, in which (a) is a top view and (b) a sectional view taken along line N–N' of (a);

FIG. 28 is a graph useful in describing the distribution of light intensity on an image plane in a case where multi-stage focusing exposure is performed using the photomask of FIG. 25;

FIG. 29 is a plan view showing the bit contact array of a DRAM corresponding to the fifth embodiment, in which (a) shows the contact array only and (b) shows a state in which auxiliary patterns are provided;

DESCRIPTION OF THE PREFERRED EMBODIMENTS

The present invention provides a photomask used in exposure to which is applied the four-point illumination method for inverting the phase of light that passes through mutually adjacent patterns. In a preferred mode of practicing the present invention, the photomask has first auxiliary patterns (2a in FIG. 3), which are disposed above and below and to the left and right of a main pattern (1 in FIG. 3) to be transferred, to thereby provide a transparent substrate with a surface flush with the main pattern or with a difference in level corresponding to a phase difference with respect to the main pattern that is K times 360° (where K is an integer that does not include zero), and second auxiliary patterns (2b in FIG. 3) disposed at angles of 45° with respect to the main pattern, second auxiliary patterns providing a difference in level corresponding to a phase difference, with respect to the first auxiliary patterns, that is (2L+1) times 180° (where L is an integer inclusive of zero). The contrast of the first auxiliary patterns is reduced by the second auxiliary patterns, thereby enlarging the depth of focus.

Preferred embodiments of the present invention will now be described in further detail with reference to the drawings.

[First Embodiment]

A photomask according to a first embodiment of the present invention will now be described with reference to FIGS. 1 and 2.

Figure 1:
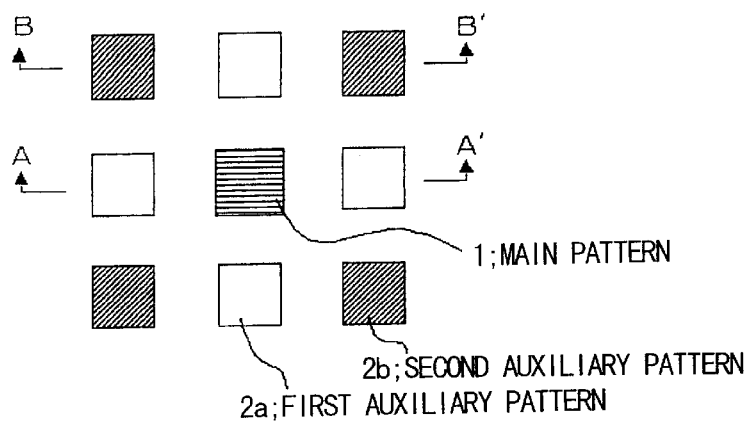
FIG. 1 is a diagram schematically illustrating the construction of a photomask according to a first embodiment of the present invention, in which (a) is a top view, (b) a sectional view taken along line A–A' of (a) and (c) a sectional view taken along line B–B' of (a)
Figure 1:
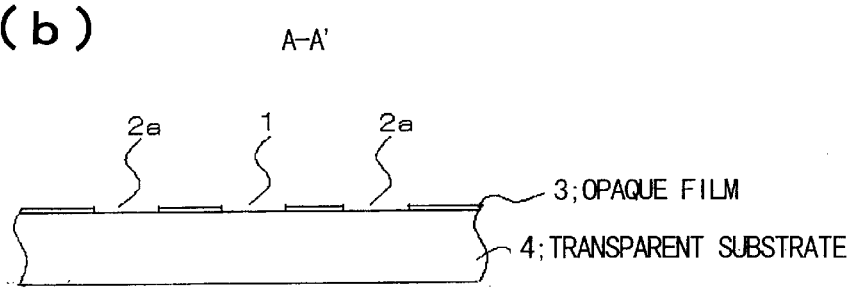
Figure 1:
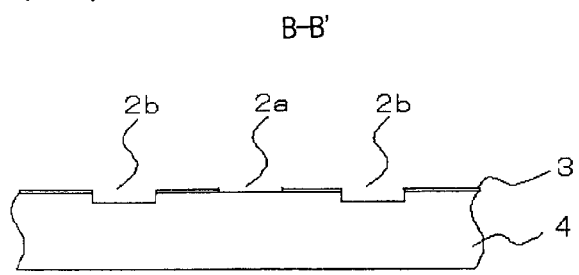

FIG. 1 is a diagram illustrating part of a photomask according to the first embodiment, in which (a) is a plan view, (b) a sectional view taken along line A–A' of (b), and (c) a sectional view taken along line B–B' of (c). FIG. 2 illustrates graphs useful in describing effects in a case where exposure is performed using the photomask of FIG. 1, in which (a) is a graph showing the distribution of light intensity on an image plane and (b) is a graph showing the contrast of a main pattern plotted against defocusing, i.e., a shift in the position of the focal point.

As shown in (a) of FIG. 1, the photomask according to the first embodiment has first auxiliary patterns 2a disposed above and below and to the left and right of a pattern (main pattern 1) to be transferred, the main pattern being isolated or spaced away from other patterns to such an extent that the effects of interference do not appear. The phase of the auxiliary patterns 2a is the same as that of the main pattern 1. The photomask further includes second auxiliary patterns 2b disposed at angles of 45° with respect to the main pattern 1 (i.e., at positions corresponding to any of the sides above and below and to the left and right of the first auxiliary patterns 2a) The phase of the second auxiliary patterns 2b is the opposite of that of the main pattern 1 and of the first auxiliary patterns 2a.

The photomask is obtained by forming an opaque film (light shielding film) 3, the main ingredient of which is chrome, on a transparent substrate 4 comprising synthetic quartz, and forming the main pattern 1, first auxiliary patterns 2a and second auxiliary patterns 2b by selectively removing the opaque film 3. Though the dimensions and spacing of the patterns of the photomask differ depending upon such conditions as the wavelength of the exposing light source, examples are 0.2 $\mu$m square for the main pattern 1, 0.17 $\mu$m square for the first auxiliary patterns 2a and second auxiliary patterns 2b, and 0.4 $\mu$m for the pitch of the patterns.

Here, this embodiment takes into account a case in which the oblique incidence illumination method, especially the four-point illumination method is applied, the first auxiliary pattern 2a has the same phase as the main pattern 1 in order to enhance the contrast of the main pattern 1. In the oblique incidence illumination method, the oblique incidence of the illumination light to the mask provides the same effect as the case of the phase shift mask where the phase is reversed between the main pattern 1 and the first auxiliary pattern 2a.

On the other hand, the second auxiliary patterns 2b and the first auxiliary patterns 2a are so related as to weaken contrast by the effects of interference. The light intensity is weakened by applying the oblique incidence illumination and the phase shift mask method simultaneously. This can be considered that a phase shifted through 180° by the phase shift mask is further shifted through 180° resulting in a total shift of 360° (=0°).

According to this embodiment, a difference in optical path length is provided as means for furnishing the difference in phase. More specifically, taking into consideration the refractive index of the transparent substrate 4 and the wavelength of an excimer laser, the second auxiliary patterns 2b are obtained by etching the transparent substrate 4 to a depth of 248 nm so as to produce an optical path length that corresponds to a phase difference of 180° with respect to the phase of the first auxiliary patterns 2a. [The refractive index of the transparent substrate when a KrF excimer laser ($\lambda$=248 nm) is used is 1.5.]

The effects obtained when exposure is performed using the photomask of this embodiment will now be described.

The exposure apparatus used is a KrF excimer laser exposure apparatus having a reduction magnification of 5×(mask-pattern dimensions:pattern dimensions on the image plane=5:1) and an NA of 0.6, with four-point illumination ($\sigma c$=0.65 and $\sigma r$=0.15, where $\sigma r$ is the size of the radius of four circular apertures and $\sigma c$ is the distance between individual centers of the apertures). The photomask used is a mask in which a hole pattern having a size of 0.2 $\mu$m will be formed on the image plane.

When exposure is performed under the above-described conditions, the phases of the main pattern 1 and first auxiliary patterns 2a are made the opposite of each other by oblique incidence illumination, and the contrast of the pattern image is enhanced, therefore, by the effects of interference. However, there is no pattern on the side of the first auxiliary patterns 2a opposite the main pattern 1, and the second auxiliary patterns 2b whose phase is the opposite of the phase of the first auxiliary patterns 2a are formed alongside (in transverse direction to that for the main pattern and the first auxiliary pattern) the first auxiliary patterns 2a. As a consequence, the contrast of the pattern image declines and the first auxiliary patterns 2a therefore are not readily transferred to the semiconductor substrate.

This effect will be described with reference to FIG. 2. The distribution of light intensity shown in (a) of FIG. 2 was calculated using a lithography simulator available on the market [Prolith/2 (FINLE Technologies Inc., USA)]. Distance on the image plane is plotted along the horizontal axis and the absolute value of light intensity is plotted along the vertical axis (where the intensity of light in a sufficiently wide illumination area devoid of patterns is normalized to 1). The center peak (whose position is 0 along the horizontal axis) indicates the light intensity of the main pattern 1, and the two peaks on either side (whose positions are ±400 nm along the horizontal axis) indicate the light intensity of the first auxiliary patterns 2a. Also illustrated is a light-intensity distribution in a case where the focal point position for best focusing is shifted over a range of from 0.2 to 0.8 $\mu$m.

Figure 2A:
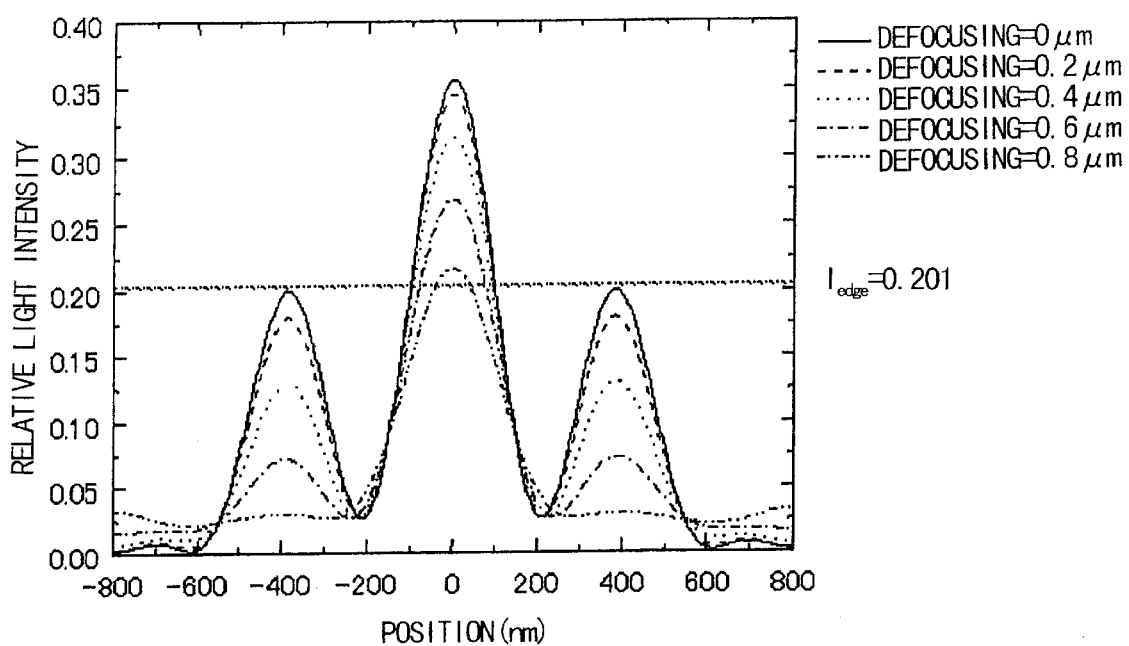
FIG. 2 is a diagram useful in describing effects in a case where the photomask according to the first embodiment is used, in which (a) is a graph illustrating the distribution of light intensity on an image plane and (b) is a graph showing contrast of a main pattern versus position of defocusing.
Figure 2B:
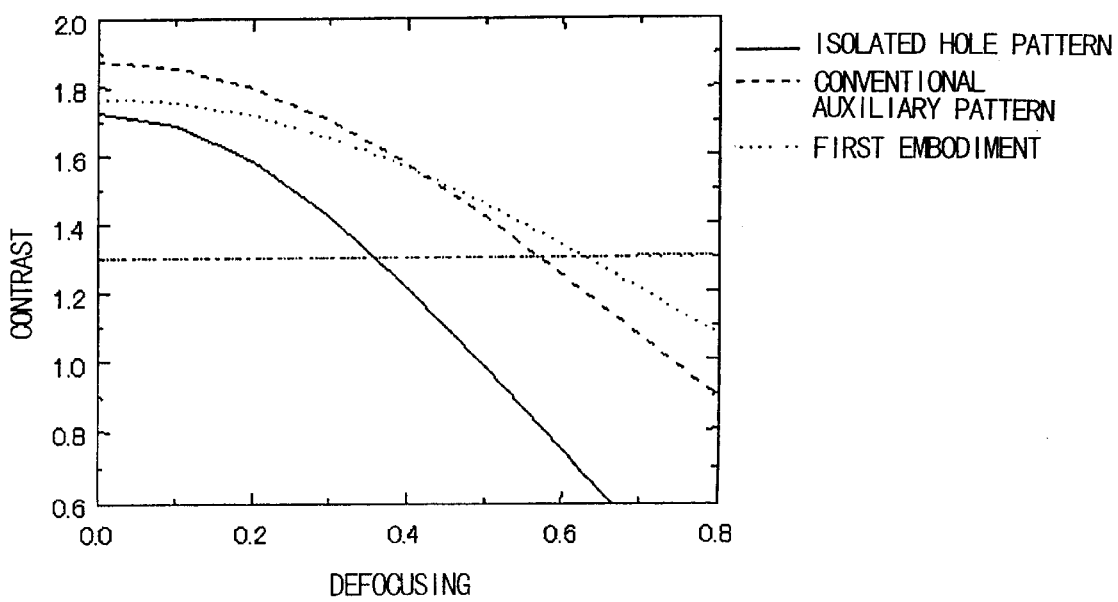

According to this embodiment, as shown in (a) of FIG. 2, the contrast of light intensity between the main pattern 1 and first auxiliary patterns 2a increases with an increase in defocusing and it is possible to obtain a large range of allowable defocusing in which the main pattern 1 is transferred but the first auxiliary patterns 2a are not. The broken line denoted by "ledge" in (a) of FIG. 2 indicates the relative intensity of light in which the pattern is opened as per the designed dimensions. The size of the first auxiliary patterns 2a can be enlarged up to a bounding value at which the relative light intensity at the position of best focus of the first auxiliary patterns 2a falls below the value of ledge.

According to this embodiment, the size of the first auxiliary patterns 2a can be enlarged to 0.17 $\mu$m square versus the main pattern 1 of size 0.2 $\mu$m square under the above-mentioned conditions. In the example of the prior art of FIG. 20 devoid of the second auxiliary patterns, 0.16 $\mu$m square is the upper limit on size. Though the difference between these sizes is not that great, the influence on contrast is extremely large in cases where defocusing occurs.

Effects when defocusing is carried out will be described with reference to (b) of FIG. 2, in which the defocused position is plotted along the horizontal axis and contrast along the vertical axis. The contrast indicates a value obtained by dividing, by ledge, the peak value of relative light intensity of the rain pattern 1 each time defocusing is performed. The solid line in the graph indicates the result of calculation in regard to an isolated pattern devoid of auxiliary patterns, the dashed line the result of calculation in regard to the prior-art pattern having only the first auxiliary patterns, and the dotted line the result of calculation in regard to the present embodiment having both the first and second auxiliary patterns.

As will be understood from FIG. 2, the present embodiment is such that the size of the first auxiliary patterns 2a can be enlarged by providing the second auxiliary patterns 2b. Even when defocusing occurs, therefore, the effect of enhancing the contrast of the main pattern 1 can be maintained and a decline in contrast can be suppressed.

For example, assume that exposure is performed with a contrast of 1.3. Whereas defocusing only on the order ±0.57 $\mu$m is allowed in the example of the prior art in such case, the present embodiment allows defocusing up to ±0.63 $\mu$m. As to the value of the contrast setting, this will depend upon such process conditions as the performance of the resist. For example, the higher the performance of the resist, the smaller the value of contrast at which resolution is possible.

Thus, according to this embodiment, the first auxiliary patterns 2a whose phase is the same as that of the main pattern 1 are provided above, below and to the left and right of the main pattern 1 to be transferred, and the second auxiliary patterns 2b, the phase whereof is opposite that of the first auxiliary patterns 2a, are provided at angles of 45° with respect to the main pattern 1 (i.e., any position of above, below or to the left or right of the first auxiliary patterns 2a). By performing exposure using the oblique incidence illumination method, the depth of focus of the main pattern 1 can be expanded under suppression of transfer of the first and second auxiliary patterns 2a, 2b. This is based on the phenomenon in the four point illumination that the contrast is enhanced between patterns of the same phase are disposed, whereas the contrast is weakened between patterns of the opposite phase. Accordingly, the depth of focus can be enlarged because it is possible to increase focusing margin, and it is possible to form an excellent, fine resist pattern even on a multilayered wiring board having a large difference in level or step on the surface thereof.

The effect that enables the depth of focus to be enlarged can be enhanced further by applying the photomask of this embodiment to the multi-stage focusing method, described in the example of the prior art, in which transfer of auxiliary patterns is suppressed by shifting the focal-point position over a number of stages. More specifically, according to the multi-stage focusing method, exposure is performed by performing focusing in multiple stages (levels or depths) from the top to the bottom of a step portion, whereby the resist is irradiated while the light that is necessary to resolve the resist is summed at each part. Though the light is summed in similar fashion also at the auxiliary pattern portions, the present embodiment is such that when defocusing is performed, the contrast of the light intensity between the main pattern 1 and the first auxiliary patterns 2a can be made greater in comparison with the example of the prior art. As a result, only the summed quantity of light at the main pattern 1 in made very large.

This embodiment has been described with regard to a case where use is made of the four-point illumination method, in which the irradiating light is emitted at an angle of 45° with respect to the direction in which the patterns are arrayed. This is an example in which the optimum effects are obtained. However, the present invention is not limited to the four-point illumination method. The effects described above can be obtained using the ring illumination method as well. This is because the distance from the first auxiliary patterns 2a, which are located above, below and to the left and right, to the main pattern 1 differs from the distance from the second auxiliary patterns 2b, which are located along the 45°-angles, to the main pattern 1. Since the spacing between the main pattern 1 and the second auxiliary patterns 2b along the 45°-angles is greater, the effect thereof is less than that of the first auxiliary patterns 2a and the main-pattern contrast reducing effect is small even though ring illumination is used. Accordingly, transfer of the first auxiliary patterns 2a can be prevented without reducing depth of focus of the main pattern.

Further, this embodiment has been described with regard to a photomask in widest use at the present time. However, the invention is similarly applicable also to a transmission-type mask for non-magnifying X-ray exposure (wavelength $\lambda=1$ nm). The invention is similarly applicable also to a reflection-type mask for EUV exposure (Extreme Ultraviolet: wavelength $\lambda=11-14$ nm), etc. Phase-shift masks have been proposed heretofore in regard to these transmission- and reflection-type masks. The present invention can be implemented by inverting the phase of the second auxiliary patterns using a material, e.g., SOG (spin-on glass), which absorbs little of the exposure wavelength, in a manner similar to these phase-shift masks.

Furthermore, it will suffice if the phase of the main pattern 1 and the phase of the first auxiliary patterns 2a disposed above, below and to the left and right are essentially the opposite of each other on the image plane and if the phase of the second auxiliary patterns 2b disposed at angles of 45° with respect to the main pattern 1 and the phase of the first auxiliary patterns 2a are essentially the same on the image plane. Accordingly, in a case where use is made of an illumination method that does not produce a phase shift, effects similar to those described above can be obtained by changing the amount of etching of the photomask or the film thickness of the SOG film of the phase-shift mask to achieve a design such that the phases of the main pattern 1 and first auxiliary patterns 2a will be the opposite of each other and the phases of the first auxiliary patterns 2a and second auxiliary patterns 2b the same as each other on the photomask.

This embodiment illustrates an example of patterns in which the main pattern 1, first auxiliary patterns 2a and second auxiliary patterns 2b are square hollow patterns. However, the present invention is not limited to such a shape, and it should be obvious that similar effects can be obtained even in cases where the patterns are circular or polygonal. Though a case in which the first auxiliary patterns 2a and second auxiliary patterns 2b are identical in size has been described, transfer of the second auxiliary patterns 2b per se can be suppressed also by making the second auxiliary patterns 2b smaller than the first auxiliary patterns 2a. Furthermore, to the extent that the mask layout allows, the size of the auxiliary patterns can be gradually reduced by successively (or in more groups or orders) providing auxiliary patterns the phases of which are opposite the phase of the second auxiliary patterns 2b.

[Second Embodiment]

Figure 3:
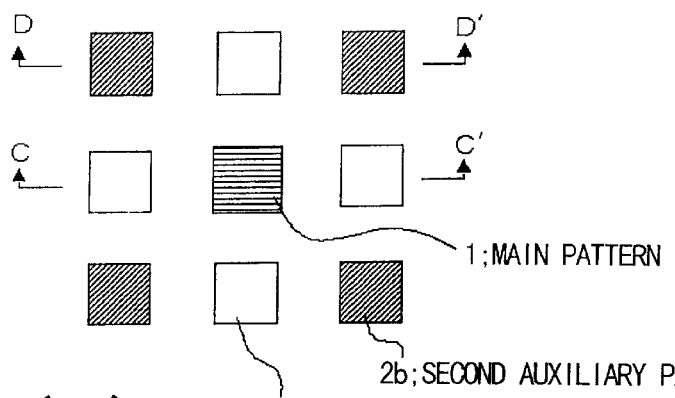
FIG. 3 is a diagram schematically illustrating the construction of a photomask according to a second embodiment of the present invention, in which (a) is a top view, (b) a sectional view taken along line C–C' of (a) and (c) a sectional view taken along line D–D' of (a)
Figure 3:
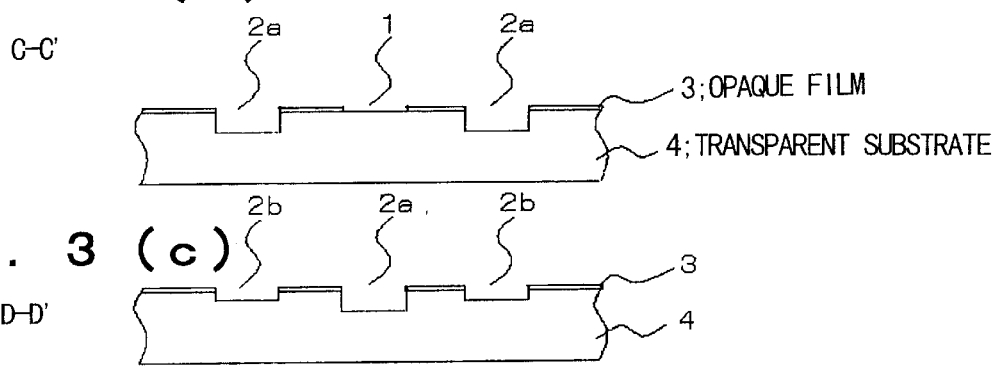
Figure 3:
Figure 4:
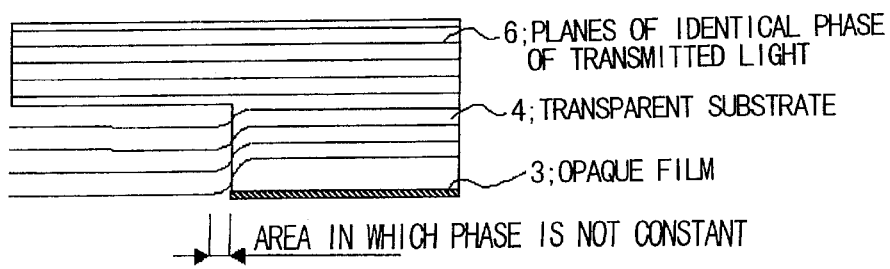
FIG. 4 is a diagram schematically illustrating disturbance of phase of transmitted light at the step portion of the photomask according to the second embodiment.

A photomask according to a second embodiment of the present invention will now be described with reference to FIGS. 3 and 4. FIG. 3 is a diagram illustrating part of a photomask according to the second embodiment, in which (a) is a plan view, (b) a sectional view taken along line C–C' of (b), and (c) a sectional view taken along line D–D' of (c). FIG. 4 is a diagram schematically illustrating a disturbance in phase at a step portion of an auxiliary pattern.

As in the first embodiment, the photomask according to the second embodiment, to which the four-point illumination method is applied, has the first auxiliary patterns 2a disposed above and below and to the left and right of the main pattern 1, which is isolated or spaced to such an extent that the effects of interference do not appear. The phase of the auxiliary patterns 2a is the same as that of the main pattern 1. The photomask further includes the second auxiliary patterns 2b disposed at angles of 45° with respect to the main pattern 1 (i.e., at positions corresponding to any of the sides above and below and to the left and right of the first auxiliary patterns 2a). The phase of the second auxiliary patterns 2b is the opposite of that of the main pattern 1 and of first auxiliary patterns 2a. In this embodiment, however, as shown in FIG. 3, the transparent substrate 4, taking into account the refractive index thereof, is etched to a depth of 496 nm in such a manner that the first auxiliary patterns 2a will produce a phase difference (360° in this embodiment) which is a whole-number multiple of 360° when irradiation is performed using light from an excimer laser. The sizes of the patterns and the exposure conditions, etc., are the same as those described in the first embodiment.

According to this embodiment, the structure adopted is one in which the photomask is engraved so as to shift the phase of the first auxiliary pattern 2a by 360° relative to the main pattern 1. As a result, as shown in FIG. 4, an area at which light impinges and is reflected to give rise to a disturbance in phase (out-of-phase, namely phases other than 0 and 360°) is formed at the side wall of the step of the first auxiliary pattern 2a. Light at the portion of disturbed phase at the outer periphery of the first auxiliary pattern 2a interferes with light of uniform phase at the center of the first auxiliary pattern 2a, whereby the intensity of light on the image plane is reduced. The light-intensity distribution on the image plane in this embodiment is not illustrated. However, as set forth in the earlier application of the present inventor (Japanese Patent Kokai Publication JP-A-10-239827), transfer of the first auxiliary patterns 2a is suppressed to an even greater extent in comparison with the first embodiment described above.

Thus, according to this embodiment, the first auxiliary patterns 2a whose phase differs by 360° from that of the main pattern 1 are provided above, below and to the left and right of the main pattern 1 to be transferred, and the second auxiliary patterns 2b, the phase whereof is opposite that of the first auxiliary patterns 2a, are provided at angles of 45° with respect to the main pattern 1. As a result, in a manner similar to that of the first embodiment, the contrast of the light intensity of the main pattern 1 can be enhanced and depth of focus can be enlarged because it is possible to increase focusing margin.

[Third Embodiment]

Figure 6:
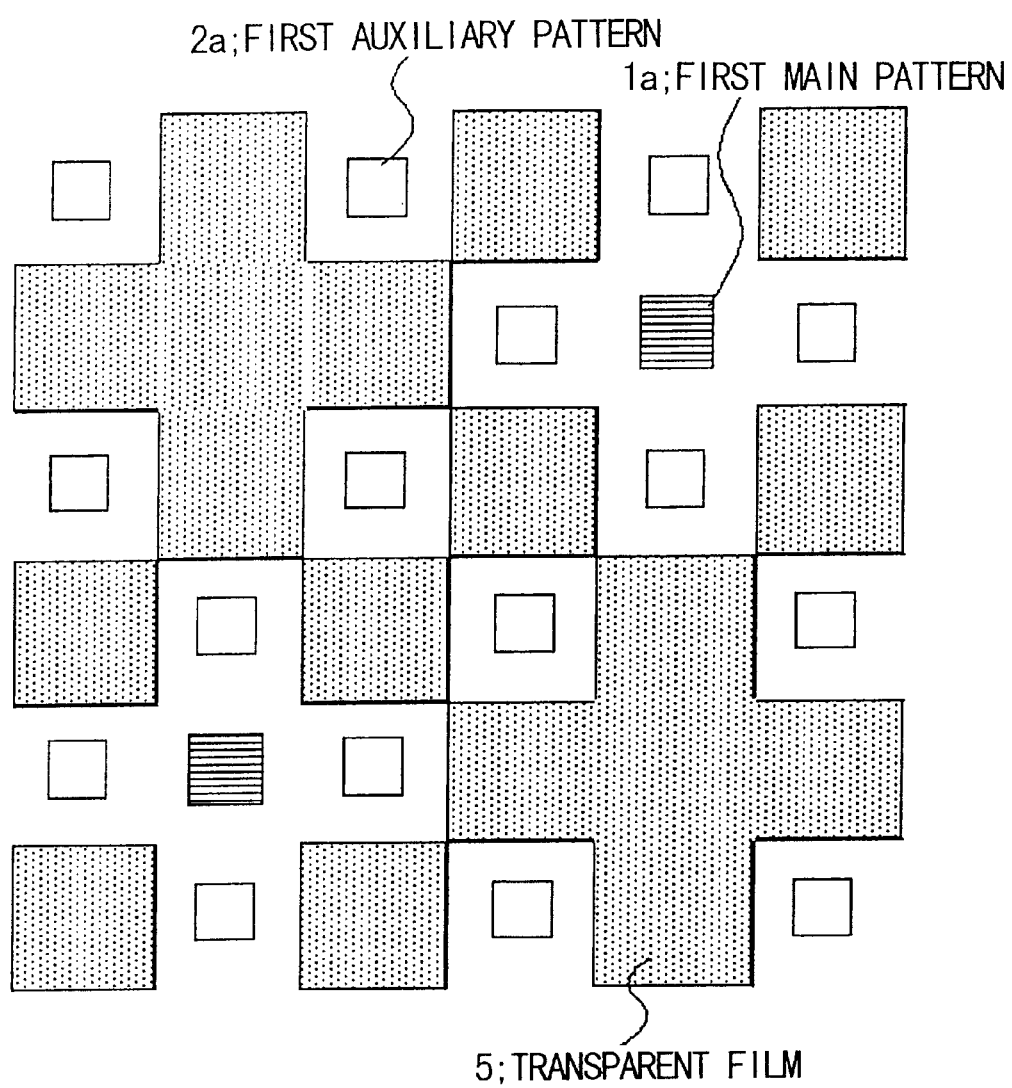
FIG. 6 is a top view useful in describing a transparent-film formation area of the photomask according to the third embodiment.
Figure 7:
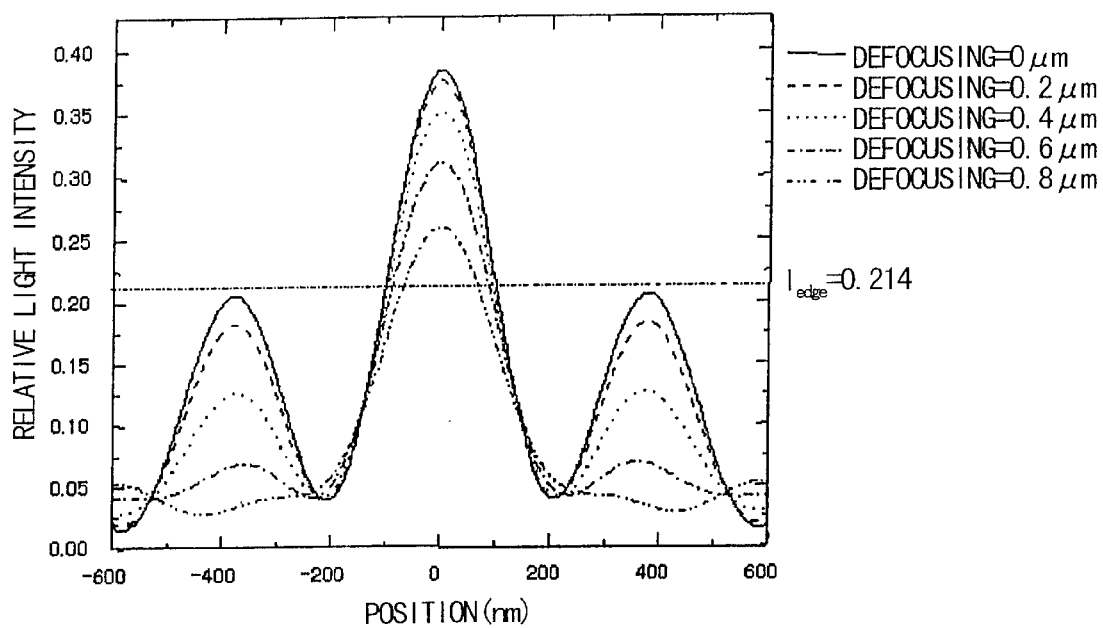
FIG. 7 is a diagram useful in describing effects in a case where the photomask according to the third embodiment is used, in which (a) is a graph illustrating the distribution of light intensity on an image plane and (b) is a graph showing contrast of a main pattern versus position of defocusing.
Figure 7:
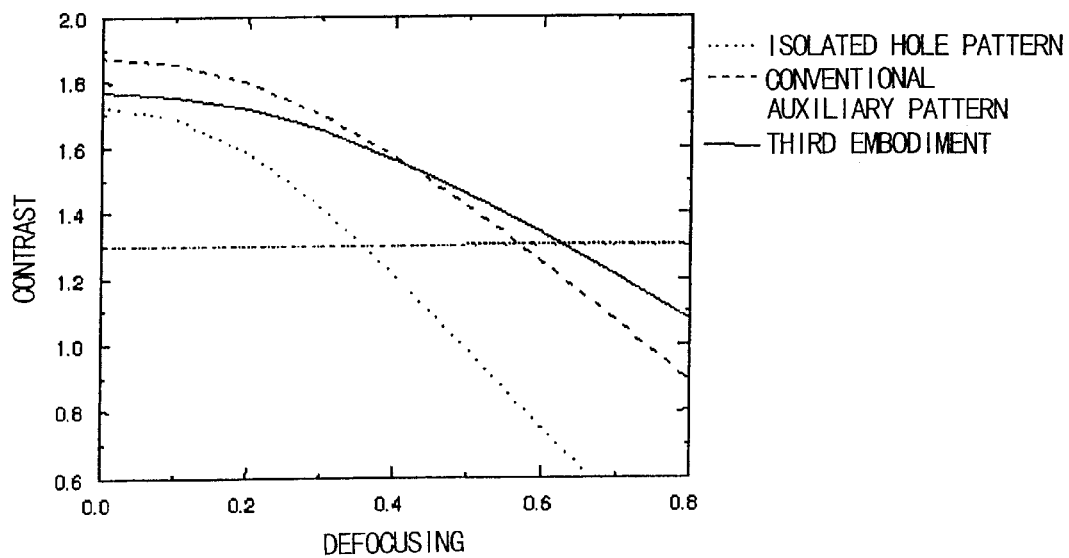

A photomask according to a third embodiment of the present invention will now be described with reference to FIGS. 5 through 7. FIG. 5 is a diagram illustrating part of a photomask according to the third embodiment, in which (a) is a plan view and (b) a sectional view taken along line E–E' of (a). FIG. 6 is a top view useful in describing an area which forms a transparent film, and FIG. 7 shows graphs useful in describing effects in a case where exposure is performed using the photomask of this embodiment. The difference between this embodiment and the first and second embodiments is that, in this embodiment, the main pattern 1 repeats in periodic fashion. Other conditions, such as the illumination conditions and exposure conditions, are the same as those of the first and second embodiment.

This embodiment is an example of a case where the invention is applied to a pattern in which a hole pattern that is 0.2 μm square is arrayed at a pitch of 1.2 μm in the horizontal and vertical directions. Neighboring auxiliary patterns are arranged by alternately inverting the phase of the main pattern. That is, the phase of light transmitted by a first main pattern 1 a is 0° and the phase of the first auxiliary patterns 2a disposed above, below and to the left and right of the first main pattern 1a also is 0°. The phase of light transmitted by the second auxiliary patterns 2b disposed at angles of 45° with respect to the first main patter 1a is 180°, and the phase of a second main pattern 1b surrounded on four sides by the second auxiliary patterns 2b also is 180°.

A method of producing a phase difference in this embodiment is as follows: A transparent film 5 comprising, e.g., SOG is used. Since the refractive index of SOG is 1.46, the film thickness t thereof is made 270 nm in accordance with the formula t=λ/2(n−1). This provides a transmitted-light phase difference of 180°. Other examples of transparent films include SiO2 film formed by sputtering and SiO2 film formed by CVD. FIG. 6 illustrates an area which forms the transparent film 5.

Figure 23:
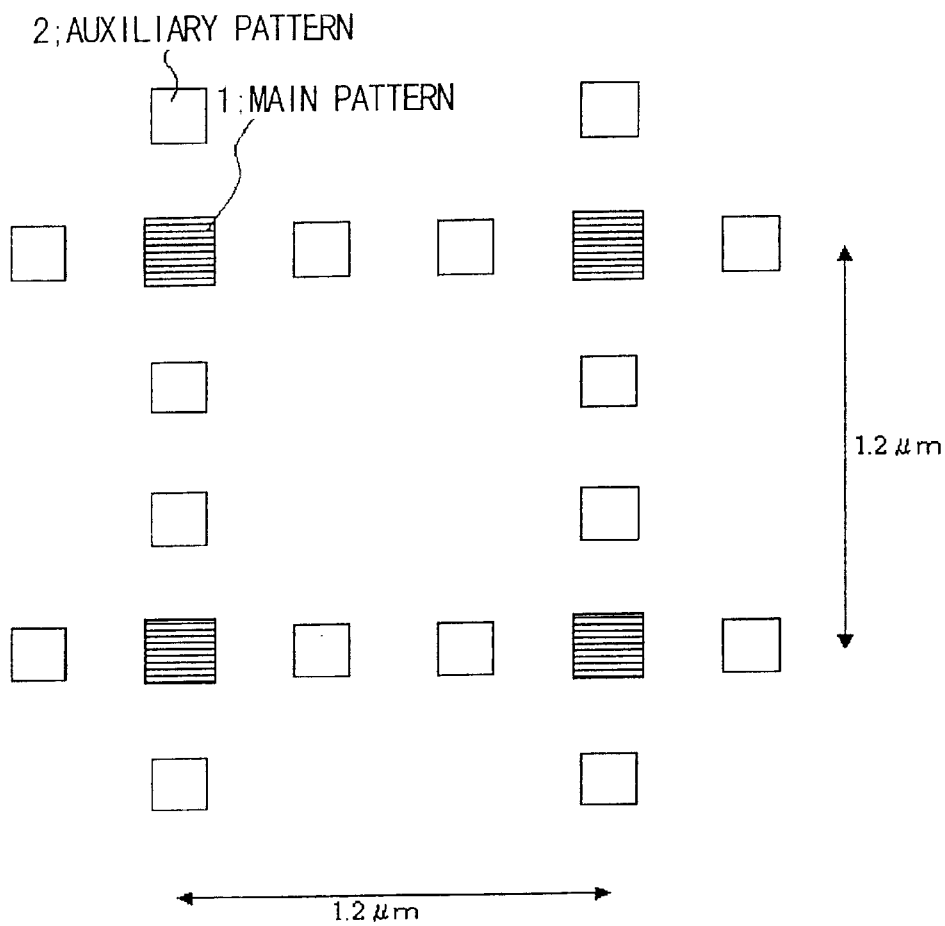
FIG. 23 is a diagram schematically illustrating the construction of a prior-art photomask as contrasted to the third embodiment.
Figure 24:
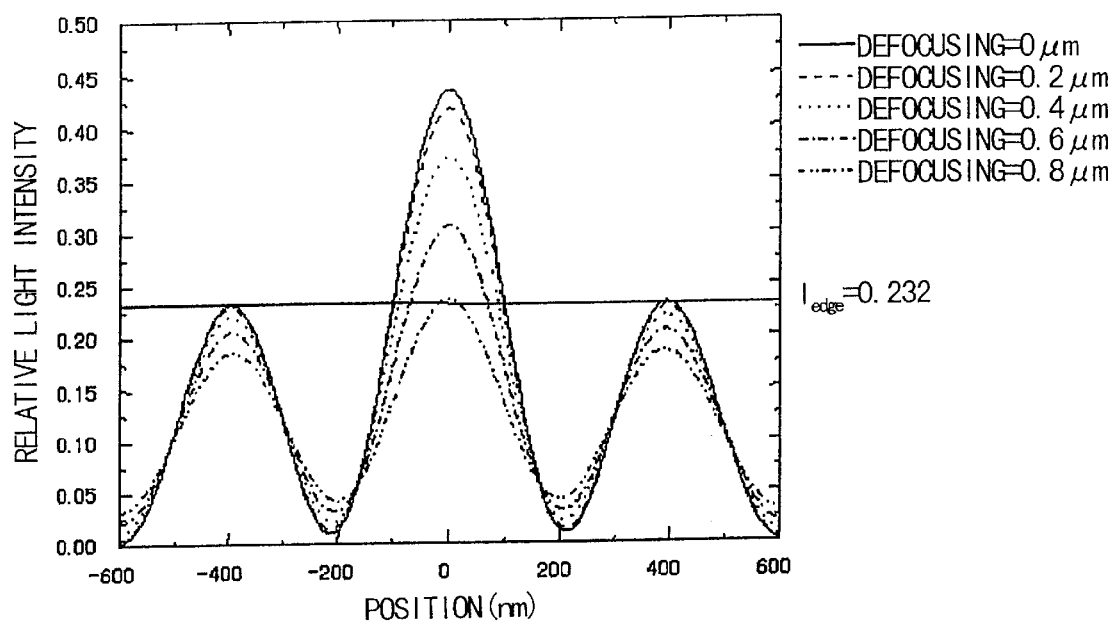
FIG. 24 is a graph useful in describing the distribution of light intensity on an image plane in a case where the photomask of FIG. 23 is used.

The effects of this embodiment will be illustrated in comparison with a conventional auxiliary pattern shown in FIG. 23. FIG. 7(a) is a light-intensity distribution in a case where the size of the auxiliary patterns 2a, 2b in FIG. 5 is 0.17 μm. Each line indicates a case where defocusing is changed. In this embodiment also there is no transfer of auxiliary patterns up to a size of 0.17 μm, which is similar to the case of an isolated hole. On the other hand, with the conventional auxiliary pattern of FIG. 23, the effect of oblique incidence illumination acts between the auxiliary patterns and contrast is enhanced. Consequently, the boundary on the size of the auxiliary patterns becomes smaller than in the case where auxiliary patterns are provided only above, below and to the left and right as shown in FIG. 20. FIG. 24 illustrates the light-intensity distribution on the image plane (on the semiconductor substrate) in a case where the size of the auxiliary pattern is made 0.15 μm in the conventional pattern. With the conventional method, however, the limit for non-transfer is 0.15 μm.

FIG. 7(b) illustrates the relationship between contrast and defocusing in a manner similar to that of the first embodiment. Assume that a contrast of 1.3 or greater is the resolution requirement. With the conventional method in which the auxiliary pattern size is 0.15 μm, the depth of focus is ±0.06 μm. By contrast, with the arrangement of this embodiment in which the auxiliary pattern size is 0.17 μm, depth of focus is enlarged to 0.71 μm.

[Fourth Embodiment]

Figure 8:
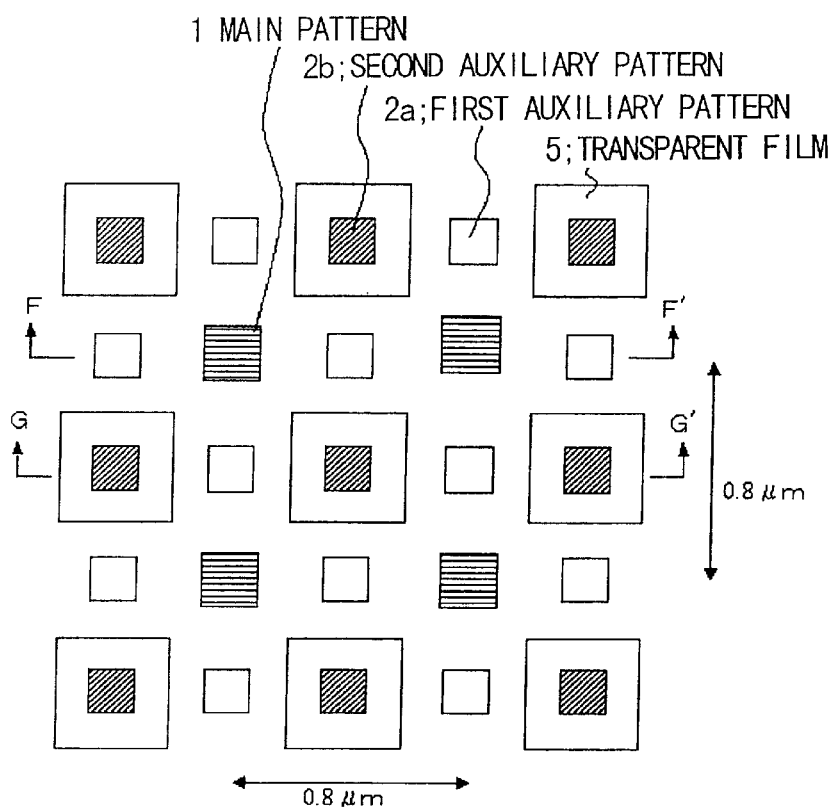
FIG. 8 is a diagram schematically illustrating the construction of a photomask according to a fourth embodiment of the present invention, in which (a) is a top view, (b) a sectional view taken along line F–F' of (a) and (c) a sectional view taken along line G–G' of (a)
Figure 8:
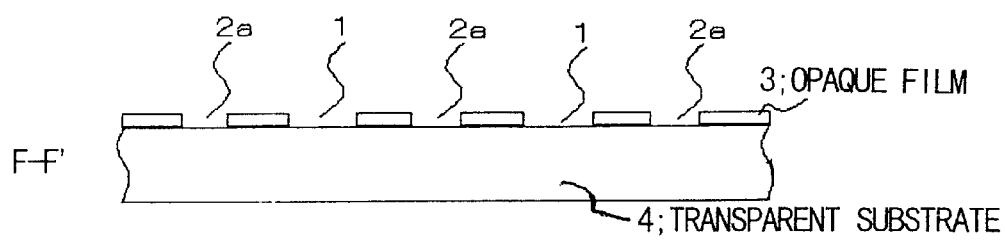
Figure 8:
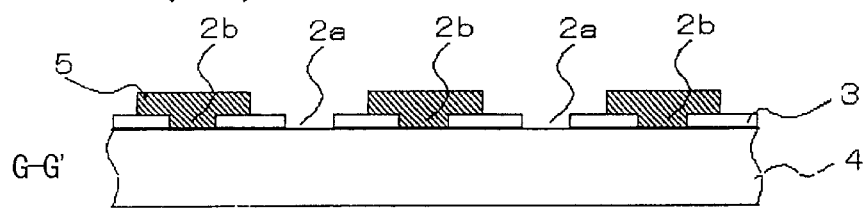
Figure 9:
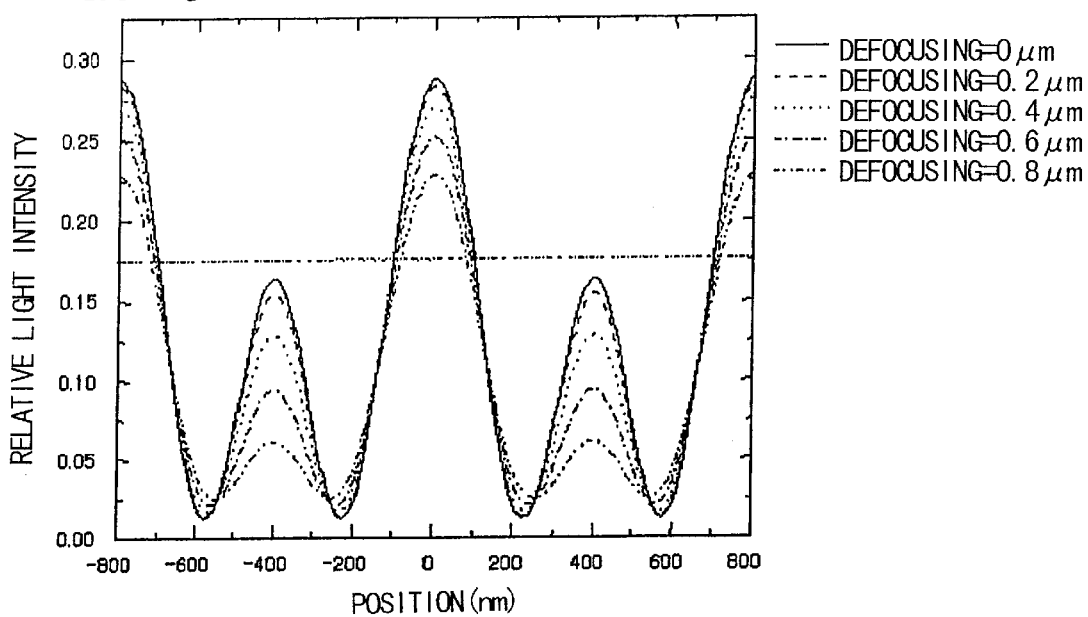
FIG. 9 is a graph illustrating the distribution of light intensity on an image plane using the photomask according to the fourth embodiment.
Figure 10:
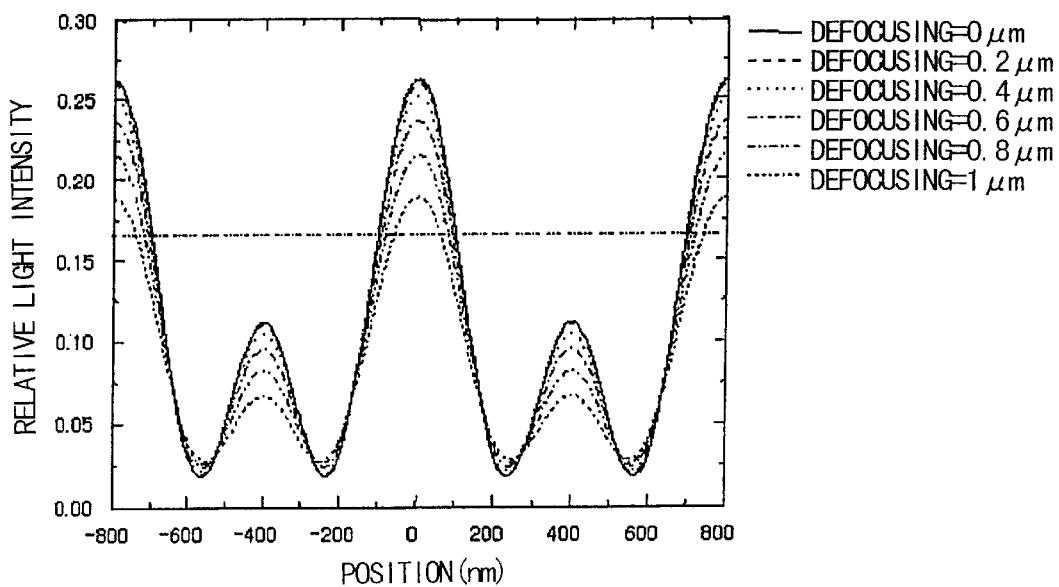
FIG. 10 is a graph illustrating the distribution of light intensity on an image plane in a case where multi-stage focusing exposure is performed using the photomask according to the fourth embodiment.

A photomask according to a fourth embodiment of the present invention will now be described with reference to FIGS. 8 to 11. FIG. 8 is a diagram illustrating part of a photomask according to the fourth embodiment, in which (a) is a plan view, (b) a sectional view taken along line F–F' of (a) and (c) a sectional view taken along line G–G' of (a). FIGS. 9 to 11 are graphs useful in describing effects in a case where exposure is performed using the photomask of this embodiment. The difference between this embodiment and the first through third embodiments is that, in this embodiment, transfer of the auxiliary patterns is prevented by multi-stage focusing exposure. Here multi-stage focusing exposure is performed twice at a distance of 1 μm. Other conditions, such as the illumination conditions and exposure conditions, are the same as those of the first through third embodiments.

This embodiment is an example of a case where the invention is applied to a pattern in which a hole that is 0.2 μm square is arrayed at a pitch of 0.8 μm in the horizontal and vertical directions. In this embodiment, first auxiliary patterns 2a whose phase is the same as that of the main pattern 1 are disposed between the main patterns 1, second auxiliary patterns 2b whose phase is the opposite of the main pattern 1 are disposed at angles of 45° with respect to the main pattern 1, and all patterns are arrayed at a pitch of 0.4 μm.

Figure 25:
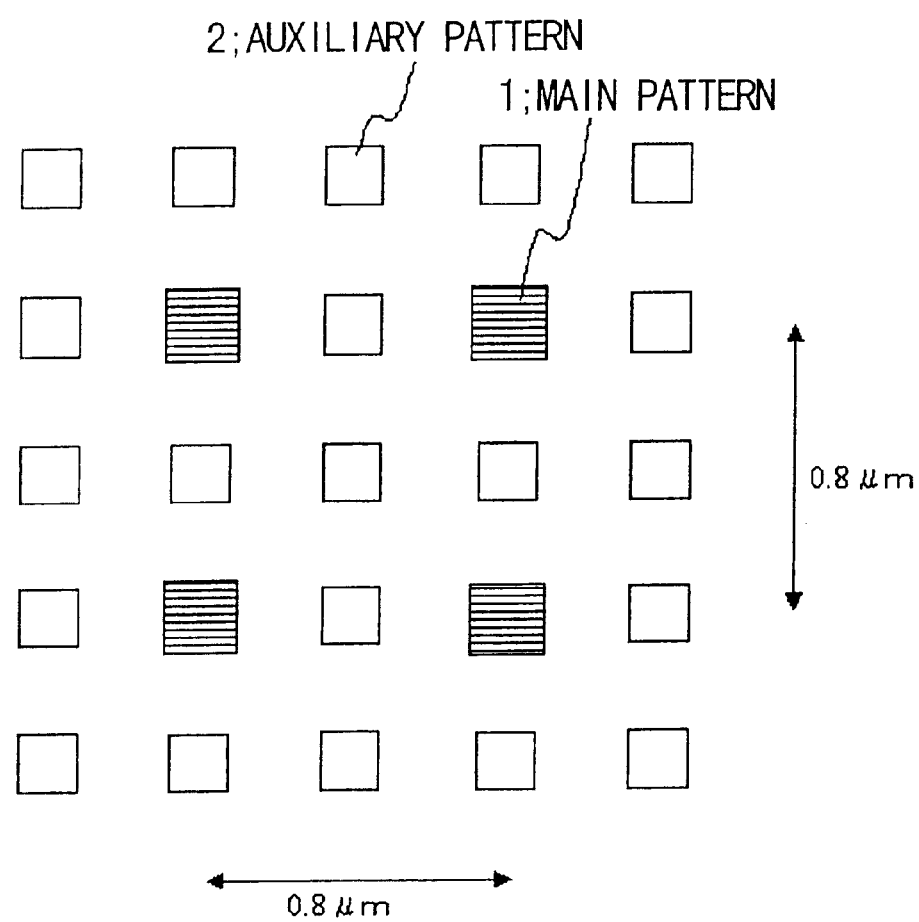
FIG. 25 is a diagram schematically illustrating the construction of a prior-art photomask corresponding to the fourth embodiment.

FIG. 9 illustrates the light-intensity distribution on the image plane in a case where exposure is performed as usual using the photomask of FIG. 8. The first and second auxiliary patterns 2a, 2b both have a size of 0.15 μm square. When the first auxiliary patterns 2a are bracketed by the main patterns 1 of the same phase, as in this embodiment, the effects of oblique incidence illumination show up strongly also for the first auxiliary patterns 2a and the intensity of light is increased. The size of auxiliary patterns that will not be transferred is a maximum of 0.15 μm. With he conventional auxiliary patterns shown in FIG. 25, the size of auxiliary patterns that will not be transferred is 0.15 μm.

Figure 26:
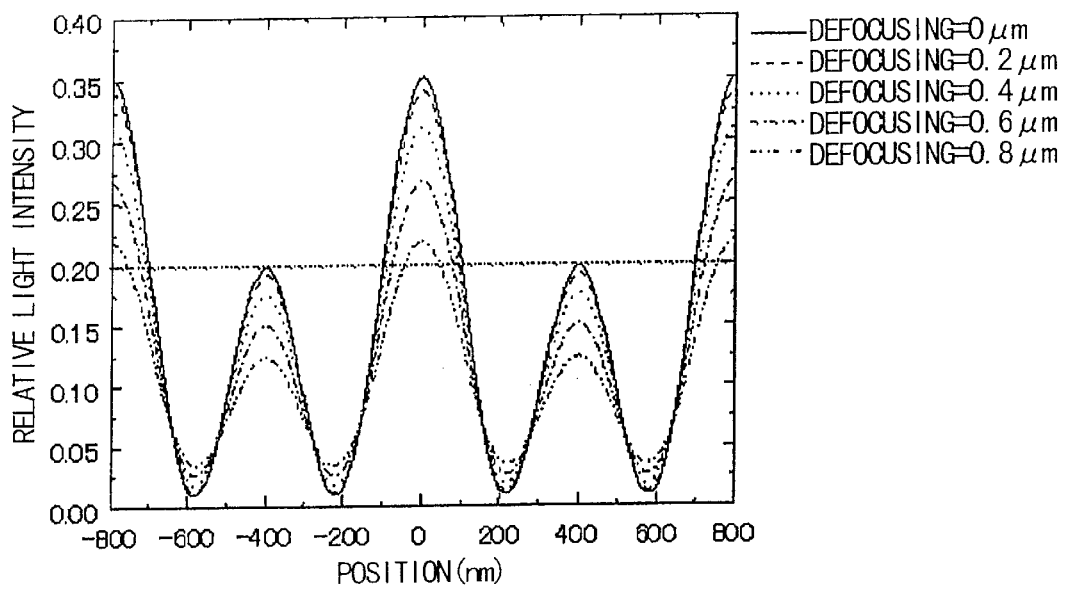
FIG. 26 is a graph useful in describing the distribution of light intensity on an image plane in a case where the photomask of FIG. 25 is used.

FIG. 26 illustrates the light-intensity distribution in a case where exposure is performed as usual using a conventional auxiliary-pattern mask (auxiliary-pattern size=0.15 μm). Though the light intensity of the auxiliary pattern comes fairly close to the light-intensity level ledge at which pattern transfer is predicted, it is just possible to use the 0.15 μm auxiliary pattern without exceeding ledge. When such closing focusing with the usual method of exposure employing such an array is performed, the effect of enlarging the size of the auxiliary patterns is not obtained to a very great extent. However, when the light-intensity distribution of the embodiment shown in FIG. 9 and the light-intensity distribution of the conventional auxiliary patterns shown in FIG. 26 are compared, it is found that when defocusing is performed, there is a large difference in the decline of the light intensity of the auxiliary patterns.

Thus, according to this embodiment, the light intensity of the auxiliary patterns declines sharply owing to defocusing. As a result, transfer of the auxiliary patterns can be prevented by performing multi-stage focusing exposure, which superimposes light intensities obtained by defocusing. With the conventional method, on the other hand, the decline in light intensity of the auxiliary patterns is less than that of the main pattern and, hence, it is not possible to prevent transfer of the auxiliary patterns even when light intensities obtained by defocusing are superimposed.

FIG. 10 illustrates the light-intensity distribution in a case where multi-stage focusing exposure is performed using the photomask of FIG. 8. Here exposure is performed twice and the focusing distance is 1 μm. Defocusing=0 μm means repeating defocusing=±0.5 with ordinary exposure. The light intensity at defocusing=0.2 μm is the combined light-intensity distributions of defocusing=−0.3 µm and 0.7 µm of ordinary exposure. As shown in FIG. 10, the light intensity of the auxiliary patterns can be reduced by the photomask and exposure method of this embodiment. In a case where multi-stage focusing exposure is used, the size limit of the auxiliary patterns can be enlarged to 0.2 µm, which is the same as that of the main pattern. FIG. 11 illustrates the light-intensity distribution in a case where the size of the auxiliary patterns is 0.2 µm.

Figure 27:
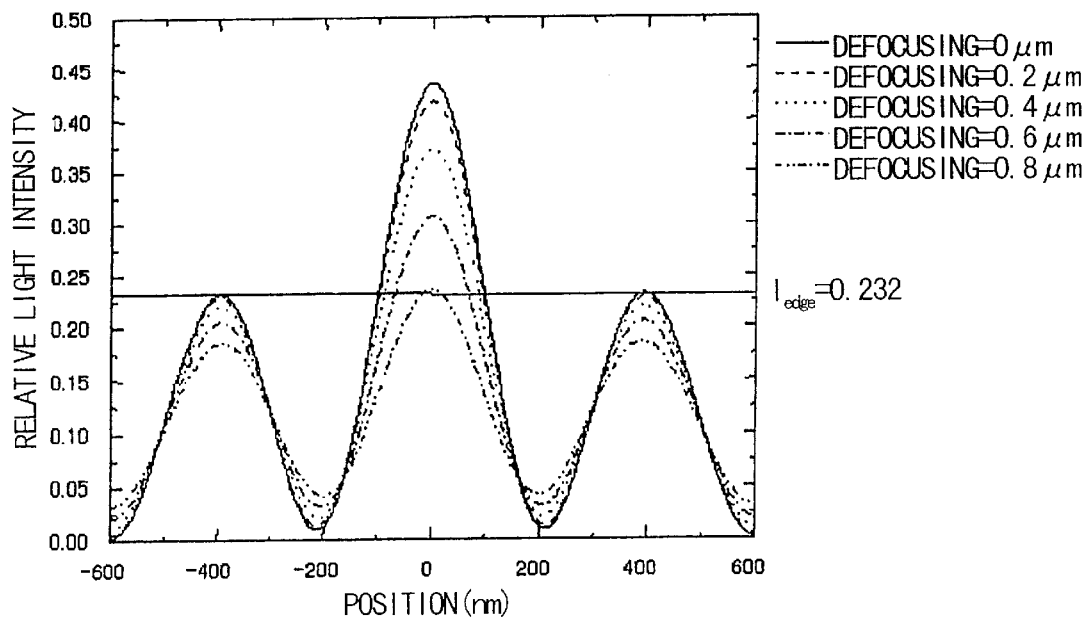
FIG. 27 is a graph useful in describing the distribution of light intensity on an image plane in a case where multi-stage focusing exposure is performed using the photomask of FIG. 25.

FIG. 27 illustrates the light-intensity distribution in a case where multi-stage focusing exposure is performed using a conventional auxiliary-pattern mask (auxiliary-pattern size= 0.15 µm). With the conventional auxiliary-pattern mask, transference of the auxiliary pattern conversely rises by performing multi-stage focusing exposure, and it is understood that a 0.15 µm auxiliary pattern cannot be used. The maximum auxiliary-pattern size when the conventional auxiliary-pattern mask is used with multi-stage focusing exposure is 0.13 µm. FIG. 28 illustrates the light-intensity distribution in a case where multi-stage focusing exposure is performed using a conventional auxiliary-pattern mask having a size of 0.13 µm.

The above-mentioned effects will be described using the relationship between contrast and defocusing in a manner similar to that of the first embodiment. As will be understood from the graph of FIG. 11(b) illustrating the relationship between contrast and defocusing in multi-stage focusing exposure, depth of focus with the conventional method is ±0.81 µm, whereas this embodiment makes it possible to enlarge depth of focus to ±1.05 µm.

[Fifth Embodiment]

Figure 12A:
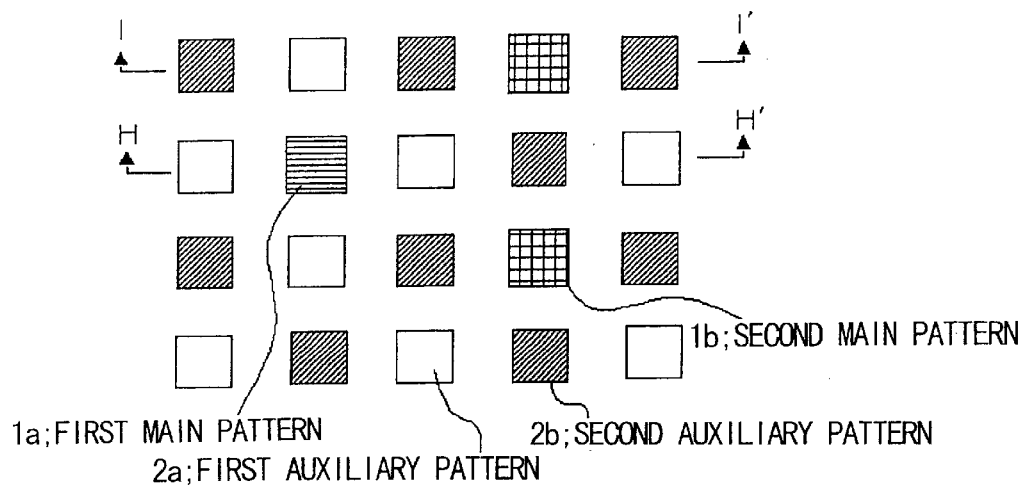
FIG. 12 is a diagram schematically illustrating the construction of a photomask according to a fifth embodiment of the present invention, in which (a) is a top view, (b) a sectional view taken along line H–H' of (a) and (c) a sectional view taken along line I–I' of (a)
Figure 12B:
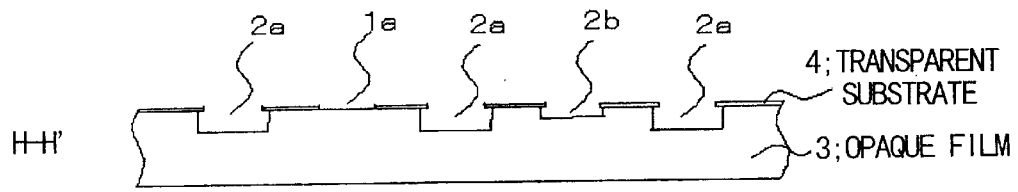
Figure 12C:
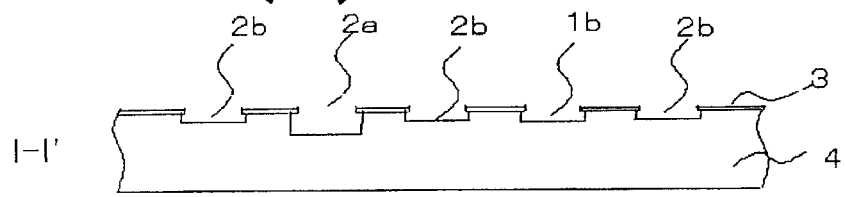

A photomask according to a fifth embodiment of the present invention will now be described with reference to FIGS. 12 to 14. FIG. 12 is a diagram illustrating part of a photomask according to the fifth embodiment, in which (a) is a plan view, (b) a sectional view taken along line H–H' of (a) and (c) a sectional view taken along line I–I' of (a). FIG. 13 is a plan view illustrating a case where the auxiliary patterns of FIG. 12 are set so that the size in the vertical direction is different from that in the horizontal direction. The difference between this embodiment and the first and second embodiments is that, in this embodiment, the main pattern 1 repeats periodically in the layout, as is often seen in a DRAM. Other conditions, such as the illumination conditions and exposure conditions, are the same as those of the first and second embodiments.

In the fifth embodiment, the present invention is applied to a repeating pattern such as the bit contact array of a DRAM shown in (a) of FIG. 29. As illustrated in FIG. 12, first auxiliary patterns 2a the phase of which is the same as that of first main patterns 1a are disposed above, below and to the left and right of the first main patterns 1a, second auxiliary patterns 2b the phase of which is the opposite of that the first auxiliary patterns 2a are disposed at angles of 45° with respect to the first main patterns 1a (i.e., above, below and to the left and right of the first auxiliary patterns 2a), and second main patterns 1b the phase of which is the same as that of the second auxiliary patterns 2b (opposite that of the first main patter 1a) are disposed at portions neighbored by the second auxiliary patterns 2b.

More specifically, according to this embodiment, there are provided a group composed of first main patterns 1a and the first auxiliary patterns 2a between which the phase difference is 0 or a whole-number (integer) multiple of 360°, and a group composed of second main patterns 1b and second auxiliary patterns 2b, the phase of which has been shifted by 180° with respect to the phase of the first main patterns 1a (or first auxiliary patterns 2a), wherein these groups are arrayed repeatedly in such a manner that the first and second auxiliary patterns will neighbor each other. With reference to (a) of FIG. 12, the first main patterns 1a and first auxiliary patterns 2a are alternately arrayed in the vertical direction of the first main patterns 1a (i.e., in the column direction), the first auxiliary patterns 2a and second auxiliary patterns 2b are alternately arrayed in a column alongside this column, and the second main patterns 1b and second auxiliary patterns 2b are alternately arrayed in a column alongside the preceding column.

By adopting this arrangement, the first main patterns 1a and the first auxiliary patterns 2a, or the second main patterns 1b and the second auxiliary patterns 2b, are so related as to enhance the contrast of light intensity. Since the first auxiliary patterns 2a and second auxiliary patterns 2b are opposite in phase and repeat, the first and second auxiliary patterns are related in such a manner that the contrast of light intensity of these auxiliary patterns is weakened.

The auxiliary patterns bordered on three sides by patterns of opposite phase will not readily be transferred to a semiconductor substrate even if the size thereof is enlarged. However, it is necessary to reduce the size of the auxiliary patterns bracketed (or sandwiched) by the main patterns of the same phase. Accordingly, as shown in FIG. 13, it is preferred that the auxiliary patterns bracketed by the main patterns of the same phase be made smaller than the auxiliary patterns bordered on three sides by the patterns of opposite phase. In a case where multi-stage focusing exposure is used, the size of the auxiliary patterns bordered on three sides by the patterns of opposite phase is made 0.2 µm and the size of the auxiliary patterns bracketed by the main patterns of the same phase is made 0.15 µm.

Figure 14:
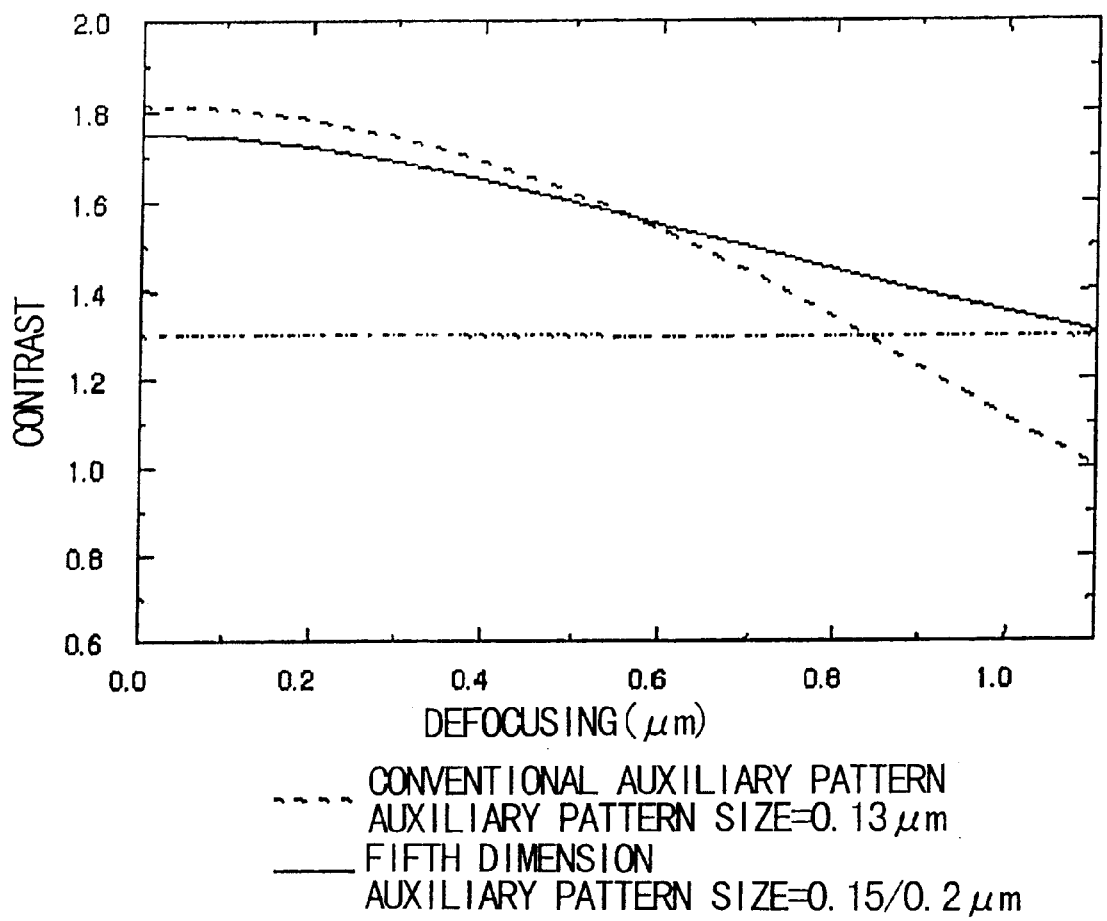
FIG. 14 is a graph showing contrast of a main pattern versus position of defocusing on an image plane in a case where the photomask of FIG. 12 is used.

FIG. 14 illustrates the relationship between contrast and defocusing for the conventional auxiliary patterns and the present embodiment. With the conventional auxiliary-pattern mask, the maximum auxiliary-pattern size that will not be transferred is 0.13 µm, and the depth of focus at this time is ±0.83 µm. By contrast, the present embodiment enlarges depth of focus to ±1.1 µm.

Thus, even in a case where a pattern repeats periodically, the layout of the first auxiliary patterns 2a and second auxiliary patterns 2b is so contrived that auxiliary patterns having different phases from each other are arrayed in alternating fashion, thereby making it possible to strengthen the contrast of the main patterns 1 and weaken the light intensity of the auxiliary patterns to an extent greater than that achieved with the conventional layout shown in (b) of FIG. 29. As a result, focusing margin can be enlarged.

In this embodiment, a photomask is formed by etching to provide a phase difference for the second main patterns 1b as well. In the main pattern, however, a step portion having a steep slope weakens the light intensity of the main pattern 1 per se. In order to mitigate the influence of this step portion, an opaque film is formed to cover the step produced by etching. The structure in which the opaque film overhangs can be formed by subjecting the transparent substrate to anisotropic etching using a gas such as $CHF_3$ and then performing isotropic etching using an etching solution such as buffered hydrofluoric acid.

[Sixth Embodiment]

Figure 15A:
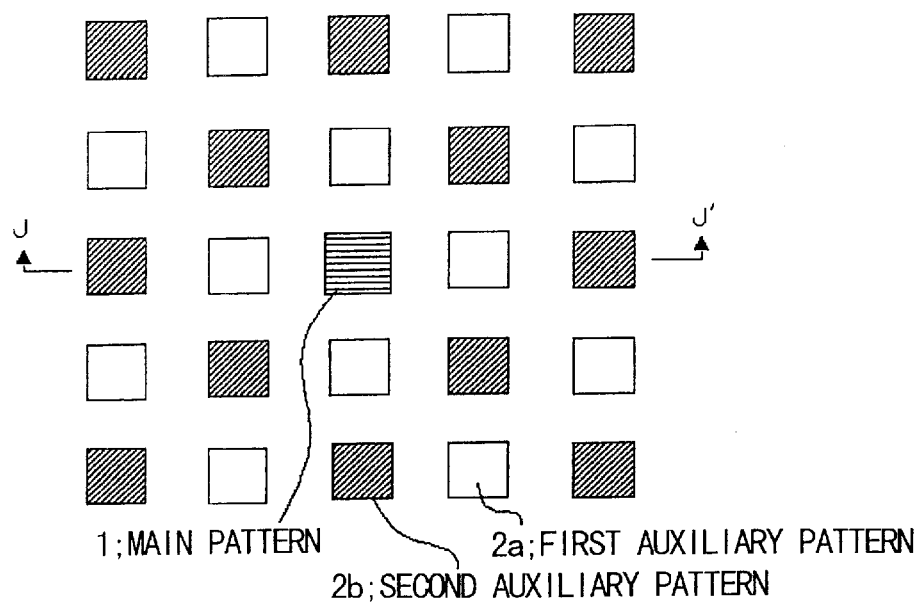
FIG. 15 is a diagram schematically illustrating the construction of a photomask according to a sixth embodiment of the present invention, in which (a) is a top view and (b) a sectional view taken along line J–J' of (a)
Figure 15B:
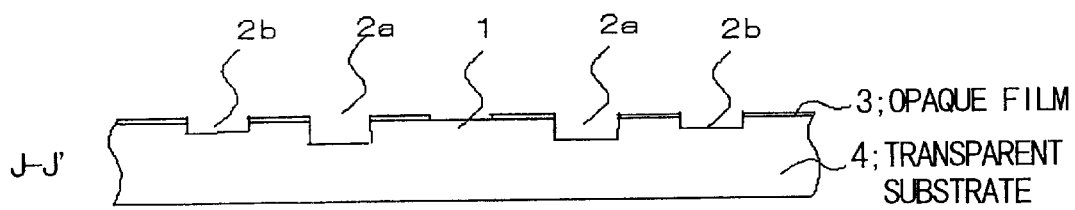

A photomask according to a sixth embodiment of the present invention will now be described with reference to FIGS. 15 and 16. FIG. 15 is a diagram illustrating part of a photomask according to the sixth embodiment, in which (a) is a plan view and (b) a sectional view taken along line J–J' of (a). FIG. 16 is a diagram useful in describing effects in a case where exposure is performed using the photomask according to the sixth embodiment. The sixth embodiment is described in regard to a case where the array of auxiliary patterns of the first and second embodiments is repeated and expanded toward the outer side. Other conditions, such as the illumination conditions and exposure conditions, are the same as those of the first embodiment.

According to the sixth embodiment, as shown in FIG. 15, first auxiliary patterns 2a of the same phase (phase difference 0 or a whole-number (integer) multiple of 360°, with the phase difference being 360° in this embodiment) as that of the main pattern 1 are disposed above, below and to the left and right of the main pattern 1, second auxiliary patterns 2b the phase of which is the opposite of that of the first auxiliary patterns 2a are disposed at angles of 45° with respect to the main pattern 1 (i.e., at positions corresponding to any of the sides above and below and to the left and right of the first auxiliary patterns 2a), and auxiliary patterns of mutually opposing phase are successively disposed at portions on the outer side of the array neighboring the first auxiliary patterns 2a or second auxiliary patterns 2b.

According to the first and second embodiments, there are no auxiliary patterns on one side of the first auxiliary patterns 2a or second auxiliary patterns 2b provided about the main pattern 1 and, as a consequence, the contrast of the first auxiliary patterns 2a per se or second auxiliary patterns 2b per se cannot be reduced satisfactorily. According to this embodiment, however, auxiliary patterns that are always opposite in phase are placed on the outer side of the first auxiliary patterns 2a or second auxiliary patterns 2b. This makes it possible to sufficiently reduce the contrast of the auxiliary patterns themselves.

Figure 30A:
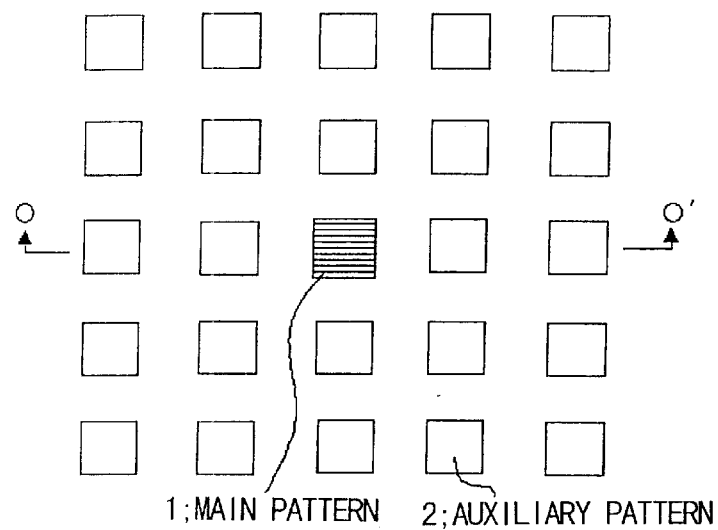
FIG. 30 is a diagram schematically illustrating the construction of a prior-art photomask as contrasted to the sixth embodiment, in (a) is a top view and (b) a sectional view taken along line O–O' of (a)
Figure 30B:
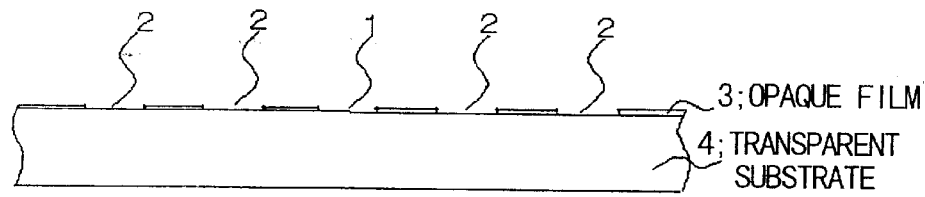
Figure 31:
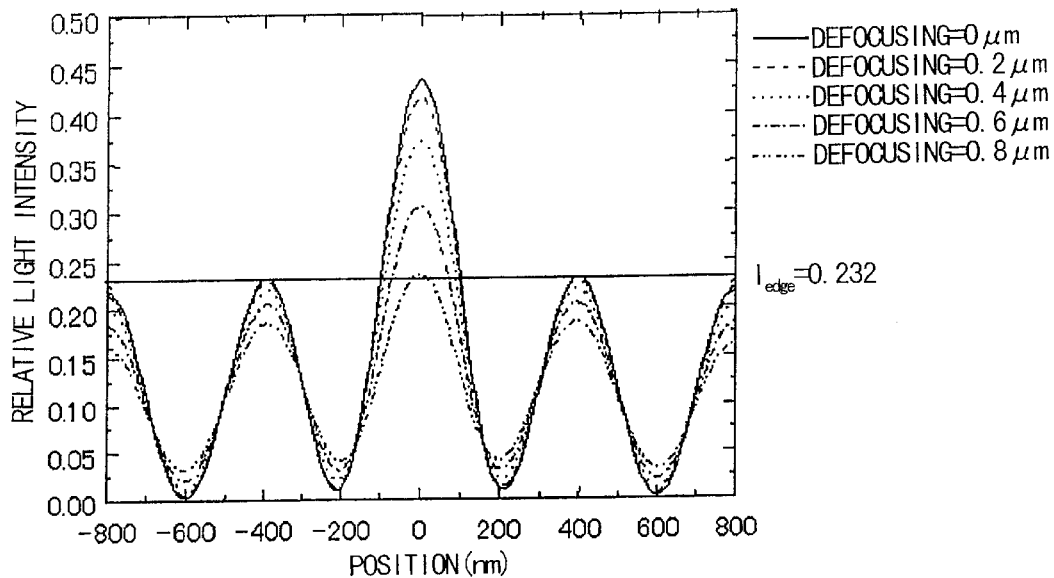
FIG. 31 is a graph useful in describing the distribution of light intensity on an image plane in a case where the photomask of FIG. 30 is used.

As shown in FIG. 16, the size of the first auxiliary patterns 2a can be increased to 0.17 μm square, in a manner similar to the embodiment having the periodic patterns illustrated earlier, even in a case where multiple surrounding tiers of auxiliary patterns are provided with respect to the completely isolated main pattern 1 of size 0.2 μm square. By contrast, in a prior-art example in which only first auxiliary patterns shown in FIG. 30 are provided over the entire mask, the light-intensity distribution is as shown in FIG. 31 and 0.15 μm square is the limit on the size of the first auxiliary patterns.

Thus, according to the arrangement of this embodiment, the first auxiliary patterns 2a or second auxiliary patterns 2b, with the exception of those adjacent to the main pattern 1, are surrounded by auxiliary patterns of opposite phase. This makes it possible to fully reduce contrast in four-point illumination so that focusing margin can be enlarged over that of the above-described embodiments.

The above-described effects can be obtained even using the ring illumination method, in a manner similar to that of the first embodiment, in the second through sixth embodiments as well, and these embodiments can be applied to a non-magnifying X-ray exposure transmission-type mask or to a reflection-type mask for EUV exposure or the like. The same effects can be obtained with the X-ray transmission-type mask or reflection-type mask as well by inverting the phase of the second auxiliary patterns using a material which absorbs little of the exposure wavelength, in a manner similar to these phase-shift masks.

Further, it will suffice if the phase of the main pattern 1 and the phase of the first auxiliary patterns 2a are essentially the opposite of each other on the image plane and if the phase of the second auxiliary patterns 2b and the phase of the first auxiliary patterns 2a are essentially the same on the image plane. Accordingly, in a case where use is made of an illumination method that does not produce a phase shift, effects similar to those described above can be obtained by changing the amount of etching of the photomask or the film thickness of the SOG film of the phase-shift mask.

Furthermore, this embodiment illustrates an example of patterns in which the main pattern 1, first auxiliary patterns 2a and second auxiliary patterns 2b are square. However, the present invention is not limited to such a shape, and it should be obvious that similar effects can be obtained even in cases where the patterns are circular or polygonal. Transfer of the second auxiliary patterns 2b per se can also be suppressed also by making the second auxiliary patterns 2b smaller than the first auxiliary patterns 2a.

[Seventh Embodiment]

Figure 17A:
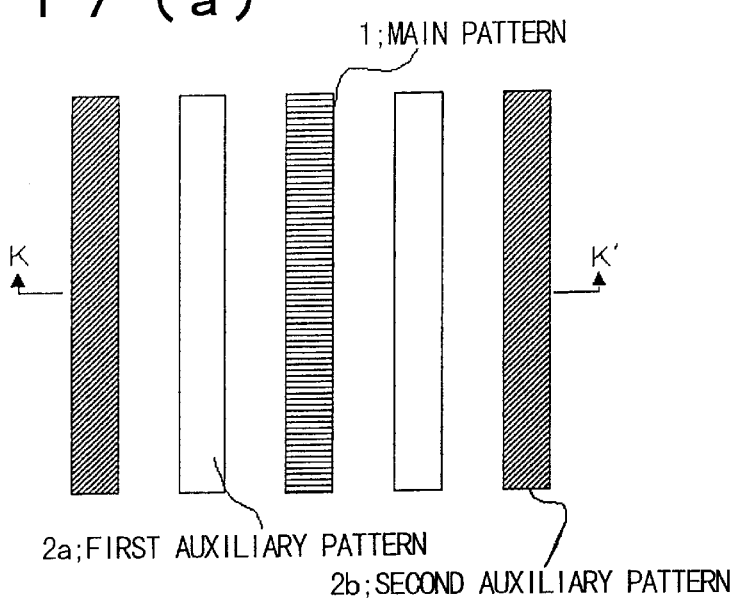
FIG. 17 is a diagram schematically illustrating the construction of a photomask according to a seventh embodiment of the present invention, in which (a) is a top view and (b) a sectional view taken along line K–K' of (a)
Figure 17B:
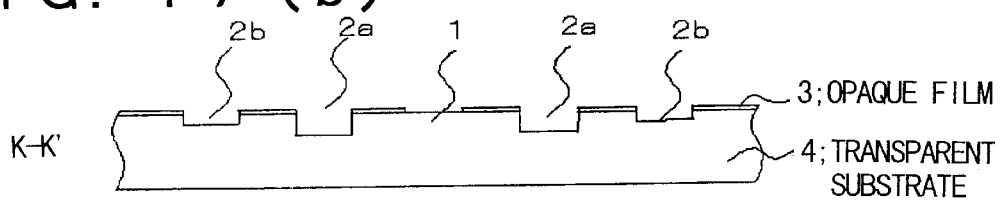

A photomask according to a seventh embodiment of the present invention will now be described with reference to FIG. 17. FIG. 17 is a diagram illustrating part of a photomask according to the seventh embodiment, in which (a) is a plan view and (b) a sectional view taken along line K–K' of (a). The seventh embodiment differs from the above-described embodiments in that, in this embodiment, the invention is applied to line-shaped (linear or strip-shaped) patterns. For this reason, the illumination conditions differ from those thus far, with use being made of two-point illumination suited to a pattern extending in one direction. Two-point illumination is an illumination method in which, instead of using the apertures of four-point illumination, illumination is performed using two apertures on an axis at right angles to a line pattern of interest on the aperture stop of the illumination optics. As a consequence, as far as unidirectional patterns are concerned, maximum depth of focus is obtained.

According to the seventh embodiment, as shown in FIG. 17, first line-shaped auxiliary patterns 2a of the same phase (phase difference: 0 or a whole-number (integer) multiple of 360°, with the phase difference being 360° in this embodiment) as that of a line-shaped main pattern 1 are disposed on both sides of the main pattern 1, and second line-shaped auxiliary patterns 2b the phase of which is the opposite of that of the first auxiliary patterns 2a are disposed on both sides of the first auxiliary patterns 2a.

This embodiment also is such that by making the direction of light irradiation and the direction at right angles to the lines coincide, the contrast of light intensity of the main pattern 1 is enhanced by the first auxiliary patterns 2a disposed on both sides of the main pattern 1, and the contrast of the first auxiliary patterns 2a is weakened by the second auxiliary patterns 2b of opposite phase disposed outwardly of the first auxiliary patterns 2a on the side opposite the main pattern 1. Consequently, as in the above-described embodiments, focus margin can be enlarged and excellent patterns can be formed even with regard to a semiconductor substrate having a large step.

It will suffice if the phase of the main pattern 1 and the phase of the first auxiliary patterns 2a are essentially the opposite of each other on the image plane and if the phase of the second auxiliary patterns 2b and the phase of the first auxiliary patterns 2a disposed inwardly thereof are essentially the same on the image plane. Further, transfer of the second auxiliary patterns 2b per se can also be suppressed by making the second auxiliary patterns 2b finer than the first auxiliary patterns 2a.

[Eighth Embodiment]

Figure 18:
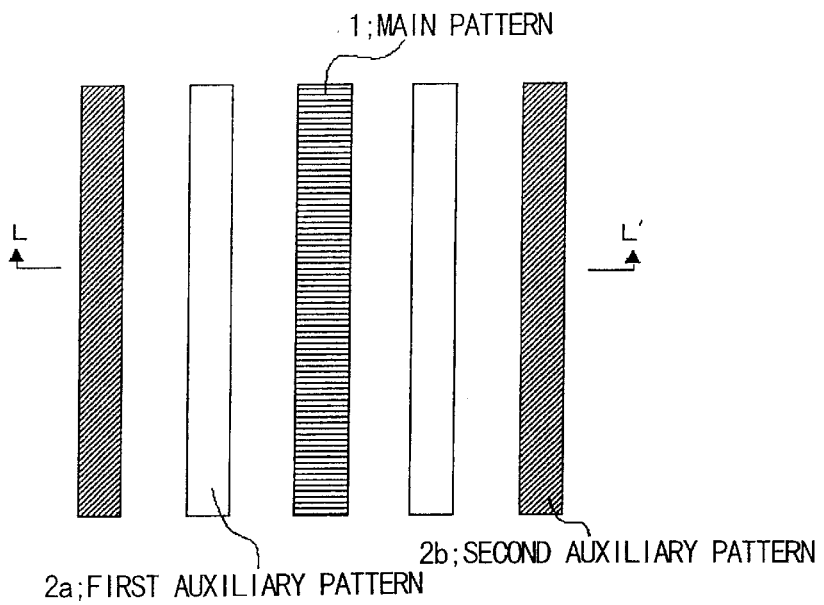
FIG. 18 is a diagram schematically illustrating the construction of a photomask according to a eighth embodiment of the present invention, in which (a) is a top view and (b) a sectional view taken along line L–L' of (a)
Figure 18:
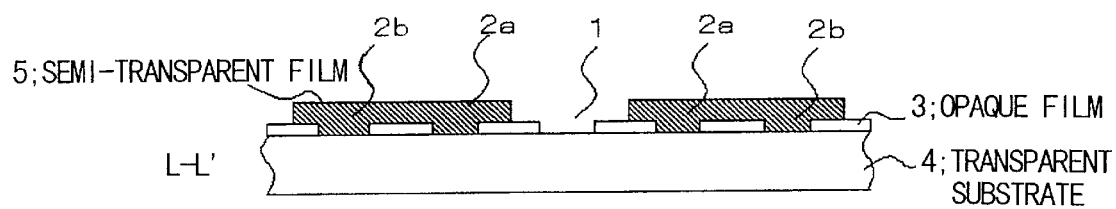

A photomask according to an eighth embodiment of the present invention will now be described with reference to FIGS. 18 and 19. FIG. 18 is a diagram illustrating part of a photomask according to the eighth embodiment, in which (a) is a plan view and (b) a sectional view taken along line L–L' of (a). The eighth embodiment differs from the above-described embodiments in that, in this embodiment, the invention is applied to a phase-shift mask. For this reason, the illumination conditions differ from those thus far, with use being made of high-interference illumination having a small $\sigma$ ($\sigma=0.3$).

As shown in FIG. 18, 0.16 $\mu$m line-shaped aperture pattern is adopted as the main pattern 1, and 0.13 $\mu$m first auxiliary patterns 2a and second auxiliary patterns 2b are disposed at a pitch of 0.32 $\mu$m. With small $\sigma$ illumination employed in a phase-shift mask, light impinges upon the mask perpendicularly and therefore the phase of the first auxiliary patterns 2a is shifted by 180° relative to the phase of the main pattern 1, thereby realizing an image forming state, which is referred to as double-beam interference, the same as that of oblique incidence illumination. In order to reduce the light intensity of the first auxiliary patterns 2a, the second auxiliary patterns 2b having the same phase are provided.

Figure 32:
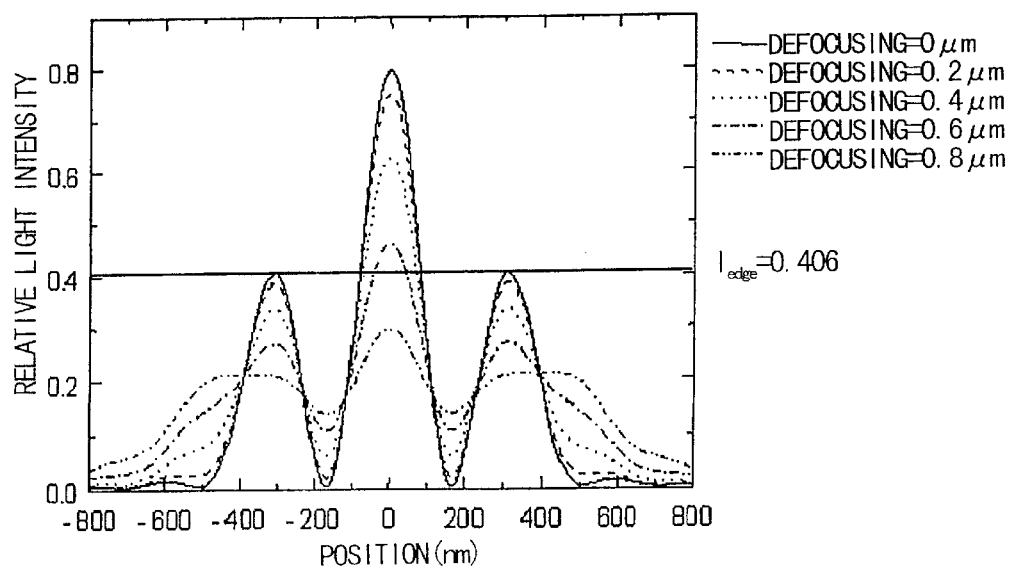
FIG. 32 is a graph useful in describing the distribution of light intensity on an image plane in a case where a prior-art photomask as contrasted to the eighth embodiment is used.

FIG. 19 illustrates the light-intensity distribution according to this embodiment, and FIG. 32 illustrates the light-intensity distribution of a conventional auxiliary-pattern phase-shift mask in which only first auxiliary patterns (only one line each side) are provided on both sides of the main pattern 1. According to this embodiment, 0.12 $\mu$m auxiliary patterns will not be transferred to a semiconductor substrate. With the conventional auxiliary patterns, however, the auxiliary patterns together strengthen the light intensity owing to the effect of the phase-shift mask and the limit on auxiliary pattern size that will not be transferred is 0.09 $\mu$m. This embodiment, therefore, makes it possible to enlarge the size of applicable auxiliary patterns that will not be transferred.

Each of the foregoing embodiments describes a typical pattern layout with which the effects of the present invention are obtained. However, the present invention is such that it will suffice if the first auxiliary patterns 2a are disposed so as to strengthen the contrast of the main pattern 1 and the second auxiliary patterns 2b are disposed so as to weaken the contrast of the first auxiliary patterns 2a. Accordingly, the pattern layouts, which are changed in dependence upon the size and placement of the main pattern 1, are covered by the above-described technical concept.

Thus, in accordance with the present invention, as described above, there is provided a photomask in which the light-intensity distribution of a main pattern on an image plane is improved by providing auxiliary patterns on a substrate so as to surround the main pattern, which is the pattern to be transferred. The transfer of the auxiliary patterns is prevented by weakening the light intensity of the auxiliary patterns, and depth of focus is increased by raising the contrast between the auxiliary patterns and the main pattern. This makes it possible to form an excellent, fine resist pattern even on a multilayer wiring board having a large step.

The reason for the foregoing is as follows: In a photomask to which the modified illumination method is applied, the first auxiliary patterns whose phase is the same as that of the main pattern are placed around the main pattern, and the second auxiliary patterns, the phase of which is opposite that of the first auxiliary patterns, are placed around the first auxiliary patterns. As a result, because of the relationship between the main pattern and the first auxiliary patterns, the contrast of the main pattern is enhanced, and because of the relationship between the first auxiliary patterns and the second auxiliary patterns, the contrast of the first auxiliary patterns is weakened. Even if the position of the focal point is shifted by a large amount, therefore, the main pattern is capable of maintaining satisfactory contrast.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A photomask comprising a desired main pattern to be transferred, and a plurality of auxiliary patterns configured to produce an interference effect with said main pattern by diffraction, wherein said plurality of auxiliary patterns are constituted by two or more patterns groups which have mutually different pattern sizes and which cause light that passes through respective ones of said auxiliary patterns to have mutually different phases mutually interfering to weaken light passing one of the pattern groups on an image plane.

2. The photomask according to claim 1, wherein the photomask is used in exposure to which the four-point illumination method is applied.

3. The photomask according to claim 1, wherein the photomask is used in exposure to which a ring illumination method is applied.

4. The photomask according to claim 1, wherein the photomask is a phase-shift photomask.

5. A photomask comprising:

a desired main pattern to be transferred;

a first auxiliary pattern configured to enhance contrast of light, which passes through said main pattern, on an image plane by diffraction; and a second auxiliary pattern, which has a size not larger than that of said first auxiliary pattern, configured to weaken contrast of light, which passes through said first auxiliary pattern, on the image plane by diffraction.

6. A photomask comprising:

a desired main pattern to be transferred;

a first auxiliary pattern, which has a phase on an image plane that is substantially opposite that of said main pattern, configured to enhance contrast of said main pattern on the image plane by diffraction; and a second auxiliary pattern, which has a size not larger than that of said first auxiliary pattern and substantially the same phase on the image plane as that of said first auxiliary pattern, configured to weaken contrast of said first auxiliary pattern on the image plane.

7. A photomask comprising:

a desired main pattern to be transferred;

a first auxiliary pattern disposed on at least one side of said main pattern at such a spacing that contrast of light, which passes through said main pattern, is enhanced on an image plane; and a second auxiliary pattern disposed on at least one side of said first auxiliary pattern at such a spacing that contrast of light, which passes through said first auxiliary pattern, is weakened on the image plane by diffraction.

8. The photomask according to claim 7, wherein said main pattern, said first auxiliary pattern(s) and said second auxiliary pattern(s) are arrayed in such a positional relationship that centers of the respective patterns are connected by a straight line.

9. The photomask according to claim 7, wherein said main pattern, said first auxiliary pattern(s) and said second auxiliary pattern(s) are arrayed in such a manner that a group of straight lines composed of one or a plurality of straight lines connecting centers of respective ones of said main pattern and said first auxiliary pattern(s) and one or a plurality of straight lines connecting centers of respective ones of said first auxiliary pattern(s) and said second auxiliary pattern(s) will include at least mutually perpendicularly intersecting straight lines.

10. A photomask used in exposure to which is applied a oblique incidence illumination method for inverting the phase of light that passes through mutually adjacent patterns formed on a transparent substrate, comprising:

a desired main pattern to be transferred;

a first auxiliary pattern which provides the transparent substrate with a surface flush with said main pattern or with an optical path difference corresponding to a phase difference, with respect to said main pattern, that is K times 360° where K is an integer that does not include zero; and a second auxiliary pattern which provides the transparent substrate with an optical path difference corresponding to a phase difference, with respect to said first auxiliary patterns, that is (2L+1) times 180° where L is an integer inclusive of zero.

11. The photomask according to claim 10, wherein said first auxiliary pattern is shaped such that the size thereof is no less than approximately 4/5 the size of said main pattern.

12. The photomask according to claim 10, wherein said first auxiliary pattern and said second auxiliary pattern are shaped such that the sizes thereof are no less than approximately 4/5 the size of said main pattern.

13. The photomask according to claim 10, wherein said first auxiliary pattern is shaped such that the size thereof is no less than approximately 4/5 the size of said pattern to be transferred, and the size of said second auxiliary pattern is smaller than that of said first auxiliary pattern.

14. The photomask according to claim 10, wherein the photomask is used in exposure to which a four-point illumination method is applied.

15. The photomask according to claim 10, wherein said optical path difference is produced by a difference in level formed by etching said transparent substrate.

16. The photomask according to claim 10, wherein said optical path difference is produced by a transparent film formed on said transparent substrate.

17. A multiple-stage focusing exposure method for performing exposure a plurality of times by achieving focusing on at least upper and lower levels of a difference in level when an image of exposing light is formed on a resist film that has been applied to a semiconductor substrate having the difference in level, wherein exposure is performed using the photomask described in claim 10.

18. A photomask used in exposure to which is applied a modified illumination method for inverting phase of light that passes through mutually adjacent patterns formed on a transparent substrate, comprising:

four first auxiliary patterns disposed on a mask plane above and below and to the left and right of and a predetermined distance away from a desired main pattern to be transferred, thereby providing the transparent substrate with a surface flush with said main pattern or with an optical path difference corresponding to a phase difference, with respect to said main pattern, that is K times 360° where K is an integer that does not include zero; and four second auxiliary patterns disposed at positions corresponding to any of the sides above and below and to the left and right of said first auxiliary patterns at angles of 45° with respect to said desired main pattern on the mask plane, thereby providing the transparent substrate with an optical path difference corresponding to a phase difference, with respect to said first auxiliary patterns, that is (2L+1) times 180° where L is an integer inclusive of zero.

19. The photomask according to claim 18, wherein said first auxiliary pattern is shaped such that the size thereof is no less than approximately 4/5 the size of said main pattern.

20. The photomask according to claim 18, wherein said first auxiliary pattern is shaped such that the size thereof is no less than approximately 4/5 the size of said pattern to be transferred, and the size of said second auxiliary pattern is smaller than that of said first auxiliary pattern.

21. The photomask according to claim 18, wherein the photomask is used in exposure to which a four-point illumination method is applied.

22. A photomask used in exposure to which is applied a modified illumination method for inverting phase of light that passes through mutually adjacent patterns formed on a transparent substrate, wherein:

(a) the photomask has a plurality of main patterns to be transferred, said main patterns repeating at prescribed intervals;

(b) four first auxiliary patterns are disposed on a mask plane above and below and to the left and right of and a predetermined distance away from one main pattern among said plurality of main patterns, thereby providing the transparent substrate with a surface flush with said one main pattern or with an optical path difference corresponding to a phase difference, with respect to said one main pattern, that is K times 360° where K is an integer that does not include zero;

four second auxiliary patterns being disposed on the mask plane at positions corresponding to any of the sides above and below and to the left and right of said first auxiliary patterns at angles of 45° with respect to said one main pattern, thereby providing the transparent substrate with an optical path difference corresponding to a phase difference, with respect to said first auxiliary patterns, that is (2L+1) times 180° where L is an integer inclusive of zero;

said one main pattern, said four first auxiliary patterns and said four second auxiliary patterns constructing a first group;

(c) another main pattern neighboring said one main pattern has a phase that is opposite that of said one main pattern;

four second auxiliary patterns being disposed above and below and to the left and right of and a predetermined distance away from said other main pattern, thereby providing the transparent substrate with a surface flush with said other main pattern or with an optical path difference corresponding to a phase difference, with respect to said other main pattern, that is K times 360° where K is an integer that does not include zero;

four first auxiliary patterns being disposed on the mask plane at positions corresponding to any of the sides above and below and to the left and right of said second auxiliary patterns at angles of 45° with respect to said other main pattern, thereby providing the transparent substrate with an optical path difference corresponding to a phase difference, with respect to said second auxiliary patterns, that is (2L+1) times 180° where L is an integer inclusive of zero;

said other main pattern, said four first auxiliary patterns and said four second auxiliary patterns constructing a second group; and (d) said first group and said second group are arrayed repeatedly so as to establish a relationship in which the auxiliary patterns constituting said first group are opposite in phase to the corresponding auxiliary patterns constituting said second group.

23. The photomask according to claim 22, wherein said first auxiliary pattern is shaped such that the size thereof is no less than approximately ⅕ the size of said main pattern.

24. The photomask according to claim 22, wherein said first auxiliary pattern is shaped such that the size thereof is no less than approximately ⅕ the size of said pattern to be transferred, and the size of said second auxiliary pattern is smaller than that of said first auxiliary pattern.

25. The photomask according to claim 22, wherein the photomask is used in exposure to which a four-point illumination method is applied.

26. A photomask used in exposure to which is applied a modified illumination method for inverting phase of light that passes through mutually adjacent patterns formed on a transparent substrate, wherein:

(a) the photomask has a plurality of main patterns to be transferred, said main patterns repeating at prescribed intervals in checkerboard fashion;

(b) a first auxiliary pattern is disposed on a mask plane between main patterns among said plurality of main patterns that are mutually adjacent above, below and to the left and right, thereby providing the transparent substrate with a surface flush with said main patterns or with an optical path difference corresponding to a phase difference, with respect to said main patterns, that is K times 360° where K is an integer that does not include zero; and (c) second auxiliary patterns are disposed on the mask plane between main patterns among said plurality of main patterns that are mutually adjacent at angles of 45°, thereby providing the transparent substrate with an optical path difference corresponding to a phase difference, with respect to said main patterns, that is (2L+1) times 180° where L is an integer inclusive of zero.

27. The photomask according to claim 24, wherein said first auxiliary pattern is shaped such that the size thereof is no less than approximately ⅕ the size of said main pattern.

28. The photomask according to claim 26, wherein said first auxiliary pattern is shaped such that the size thereof is no less than approximately ⅕ the size of said pattern to be transferred, and the size of said second auxiliary pattern is smaller than that of said first auxiliary pattern.

29. The photomask according to claim 26, wherein the photomask is used in exposure to which a four-point illumination method is applied.

30. A photomask used in exposure to which is applied a modified illumination method for inverting phase of light that passes through mutually adjacent patterns formed on a transparent substrate, wherein:

(a) the photomask has a plurality of main patterns to be transferred, said main patterns repeating at prescribed intervals;

(b) four first auxiliary patterns are disposed on a mask plane above and below and to the left and right of and a predetermined distance away from one main pattern among said plurality of main patterns, thereby providing the transparent substrate with a surface flush with said one main pattern or with an optical path difference corresponding to a phase difference, with respect to said one main pattern, that is K times 360° where K is an integer that does not include zero;

said one main pattern and said four first auxiliary patterns constructing a first group;

(c) another main pattern neighboring said one main pattern has a phase that is opposite that of said one main pattern;

four second auxiliary patterns being disposed above and below and to the left and right of and a predetermined distance away from said other main pattern, thereby providing the transparent substrate with a surface flush with said other main pattern or with an optical path difference corresponding to a phase difference, with respect to said other main pattern, that is K times 360° where K is an integer that does not include zero;

said other main pattern and said four second auxiliary patterns constructing a second group; and (d) said first group and said second group are arrayed repeatedly in such a manner that said first auxiliary patterns constructing said first group and said second auxiliary patterns constructing said second group neighbor each other above, below and to the left and right and such that auxiliary patterns constructing the same group overlap each other.

31. The photomask according to claim 30, wherein said four first auxiliary patterns are configured such that upper and lower patterns have a different size from left and right patterns; and said four second auxiliary patterns are configured such that upper and lower patterns have a different size from left and right patterns.

32. The photomask according to claim 31, wherein among said first auxiliary patterns, the patterns situated on the mask plane above and below said main pattern have a shape that is smaller than that of the patterns situated on the mask plane to the left and right of said main pattern; and among said second auxiliary patterns, the patterns situated on the mask plane above and below said main pattern have a shape that is smaller than that of the patterns situated on the mask plane to the left and right of said main pattern.

33. The photomask according to claim 30, wherein said first auxiliary pattern and said second auxiliary pattern are shaped such that the sizes thereof are no less than approximately ⅕ the size of said main pattern.

34. A photomask used in exposure to which is applied a modified illumination method for inverting the phase of light that passes through mutually adjacent patterns formed on a transparent substrate, comprising:

(a) four first auxiliary patterns disposed on a mask plane above and below and to the left and right of a desired main pattern to be transferred, thereby providing the transparent substrate with a surface flush with said main pattern or with an optical path difference corresponding to a phase difference, with respect to said main pattern, that is K times 360° where K is an integer that does not include zero;

(b) four second auxiliary patterns disposed at positions corresponding to any of the sides above and below and to the left and right of said first auxiliary patterns at angles of 45° with respect to said desired main pattern on the mask plane, thereby providing the transparent substrate with an optical path difference corresponding to a phase difference, with respect to said first auxiliary patterns, that is (2L+1) times 180° where L is an integer inclusive of zero; and (c) auxiliary pattern repeatedly placed outwardly of said first and second auxiliary patterns in such a manner that neighboring auxiliary patterns have phases that are the opposite of each other.

35. A photomask used in exposure to which is applied a modified illumination method for inverting the phase of light that passes through mutually adjacent patterns formed on a transparent substrate, comprising:

(a) first linear auxiliary patterns disposed on a mask plane on both sides of and a predetermined distance away from a desired linear main pattern to be transferred, thereby providing the transparent substrate with a surface flush with said main pattern or with an optical path difference corresponding to a phase difference, with respect to said main pattern, that is K times 360° where K is an integer that does not include zero; and second linear auxiliary patterns disposed on the mask plane outwardly of and a predetermined distance away from said first linear auxiliary patterns, thereby providing the transparent substrate with an optical path difference corresponding to a phase difference, with respect to said first linear auxiliary patterns, that is (2L+1) times 180° where L is an integer inclusive of zero.

36. The photomask according to claim 35, wherein said first linear auxiliary patterns have a width that is no less than approximately ⅕ the width of said pattern to be transferred.

37. The photomask according to claim 35, wherein said first linear auxiliary patterns have a width that is no less than approximately ⅕ the width of said pattern to be transferred, and said second linear auxiliary patterns have a width that is smaller than the width of said first linearly arrayed auxiliary patterns.

38. The photomask according to claim 35, wherein the photomask is used in exposure to which a two-point illumination method is applied.

39. A phase-shift photomask used in exposure that employs light perpendicularly incident on a transparent substrate, comprising:

(a) first linear auxiliary pattern disposed on a mask plane on both sides of and a predetermined distance away from a desired linear main pattern to be transferred, thereby providing the transparent substrate with an optical path difference corresponding to a phase difference, with respect to said main pattern, that is (2L+1) times 180° where L is an integer inclusive of zero; and (b) second linear auxiliary patterns disposed on the mask plane outwardly of and a predetermined distance away from said first linear auxiliary patterns, thereby providing the transparent substrate with a surface flush with said first linear auxiliary patterns or with an optical path difference corresponding to a phase difference, with respect to said first linear auxiliary pattern, that is K times 360° where K is an integer that does not include zero.

* * * * *